(12) United States Patent
Simsek-Ege et al.

(10) Patent No.: US 10,529,776 B2
(45) Date of Patent: Jan. 7, 2020

(54) CELL PILLAR STRUCTURES AND INTEGRATED FLOWS

(71) Applicant: Micron Technology, Inc., Boise, ID (US)

(72) Inventors: Fatma Arzum Simsek-Ege, Boise, ID (US); Krishna K. Parat, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/253,111

(22) Filed: Jan. 21, 2019

(65) Prior Publication Data
US 2019/0273120 A1 Sep. 5, 2019

Related U.S. Application Data

(60) Continuation of application No. 15/686,389, filed on Aug. 25, 2017, now Pat. No. 10,217,799, which is a (Continued)

(51) Int. Cl.
*H01L 27/24* (2006.01)
*H01L 45/00* (2006.01)
*H01L 27/11553* (2017.01)
*H01L 29/792* (2006.01)
*H01L 29/788* (2006.01)
(Continued)

(52) U.S. Cl.
CPC ...... *H01L 27/2454* (2013.01); *H01L 27/1158* (2013.01); *H01L 27/11553* (2013.01); *H01L 27/2481* (2013.01); *H01L 29/66825* (2013.01); *H01L 29/66833* (2013.01);
(Continued)

(58) Field of Classification Search
CPC ............ H01L 27/2454; H01L 27/1158; H01L 29/66833; H01L 29/7889; H01L 27/11553; H01L 27/2481; H01L 45/1608; H01L 29/7926
See application file for complete search history.

(56) References Cited

U.S. PATENT DOCUMENTS 5,053,840 A 10/1991 Yoshikawa
5,838,039 A 11/1998 Sato et al.
(Continued)

FOREIGN PATENT DOCUMENTS

CN 1401140 A 3/2003
CN 1791974 A 6/2006
(Continued)

OTHER PUBLICATIONS

US 9,754,952 B2, 09/2017, Dennison et al. (withdrawn)
(Continued)

*Primary Examiner* — Anthony Ho
(74) *Attorney, Agent, or Firm* — Schwegman Lundberg & Woessner, P.A.

(57) ABSTRACT

Various embodiments comprise apparatuses and methods, such as a memory stack having a continuous cell pillar. In various embodiments, the apparatus includes a source material, a buffer material, a select gate drain (SGD), and a memory stack arranged between the source material and the SGD. The memory stack comprises alternating levels of conductor materials and dielectric materials. A continuous channel-fill material forms a cell pillar that is continuous from the source material to at least a level corresponding to the SGD.

20 Claims, 11 Drawing Sheets

Related U.S. Application Data division of application No. 15/056,548, filed on Feb. 29, 2016, now Pat. No. 9,773,841, which is a continuation of application No. 13/838,579, filed on Mar. 15, 2013, now Pat. No. 9,276,011.

(51) Int. Cl.
  *H01L 29/66* (2006.01)
  *H01L 27/1158* (2017.01)

(52) U.S. Cl.
  CPC ...... *H01L 29/7889* (2013.01); *H01L 29/7926* (2013.01); *H01L 45/1608* (2013.01)

(56) References Cited

U.S. PATENT DOCUMENTS

| | | |
|---|---|---|
| 6,159,797 A | 12/2000 | Lee |
| 6,445,029 B1 | 9/2002 | Lam et al. |
| 6,583,009 B1 | 6/2003 | Hui et al. |
| 7,369,436 B2 | 5/2008 | Forbes |
| 7,682,902 B2 | 3/2010 | Hsiao et al. |
| 7,910,446 B2 | 3/2011 | Ma et al. |
| 8,124,478 B2 | 2/2012 | Park et al. |
| 8,187,936 B2 | 5/2012 | Alsmeier et al. |
| 8,258,034 B2 | 9/2012 | Ramaswamy et al. |
| 8,581,321 B2 | 11/2013 | Son et al. |
| 8,680,605 B2 | 3/2014 | Jeon et al. |
| 8,946,807 B2 | 2/2015 | Hopkins et al. |
| 9,171,863 B2 | 10/2015 | Wang |
| 9,184,175 B2 | 11/2015 | Dennison et al. |
| 9,230,986 B2 | 1/2016 | Hopkins et al. |
| 9,231,086 B2 | 1/2016 | Khoueir et al. |
| 9,276,011 B2 | 3/2016 | Simsek-Ege et al. |
| 9,431,410 B2 | 8/2016 | Sun et al. |
| 9,437,604 B2 | 9/2016 | Lu et al. |
| 9,608,000 B2 | 3/2017 | Hopkins et al. |
| 9,627,213 B2 | 4/2017 | Hee et al. |
| 9,773,841 B2 | 9/2017 | Simsek-Ege et al. |
| 9,793,282 B2 | 10/2017 | Dennison et al. |
| 9,991,273 B2 | 6/2018 | Dennison et al. |
| 10,090,317 B2 | 10/2018 | Sun et al. |
| 10,170,639 B2 | 1/2019 | Hopkins et al. |
| 10,217,799 B2 | 2/2019 | Simsek-Ege et al. |
| 2003/0155582 A1 | 8/2003 | Mahajani et al. |
| 2005/0006697 A1 | 1/2005 | Hsieh |
| 2005/0026382 A1 | 2/2005 | Akatsu et al. |
| 2005/0133851 A1 | 6/2005 | Forbes |
| 2005/0224346 A1 | 10/2005 | Holm-kennedy |
| 2006/0134846 A1 | 6/2006 | Wang |
| 2006/0237768 A1 | 10/2006 | Forbes et al. |
| 2006/0258091 A1 | 11/2006 | Deloach |
| 2007/0047304 A1 | 3/2007 | Lee et al. |
| 2007/0158736 A1 | 7/2007 | Arai et al. |
| 2008/0012061 A1 | 1/2008 | Ichige et al. |
| 2008/0064225 A1 | 3/2008 | Yau et al. |
| 2008/0067583 A1 | 3/2008 | Kidoh et al. |
| 2008/0173928 A1 | 7/2008 | Arai et al. |
| 2008/0253183 A1 | 10/2008 | Mizukami et al. |
| 2008/0277720 A1 | 11/2008 | Youn et al. |
| 2008/0315330 A1 | 12/2008 | Walker et al. |
| 2009/0026460 A1 | 1/2009 | Ou et al. |
| 2009/0096010 A1 | 4/2009 | Hyun |
| 2009/0097318 A1 | 4/2009 | Sarin et al. |
| 2009/0121271 A1 | 5/2009 | Son et al. |
| 2009/0184360 A1 | 7/2009 | Jin |
| 2009/0230458 A1 | 9/2009 | Ishiduki et al. |
| 2009/0230459 A1 | 9/2009 | Kito et al. |
| 2009/0262295 A1 | 10/2009 | Hong et al. |
| 2009/0283813 A1 | 11/2009 | Ishii et al. |
| 2009/0283819 A1 | 11/2009 | Ishikawa et al. |
| 2009/0290412 A1 | 11/2009 | Mouli |
| 2010/0003795 A1 | 1/2010 | Park et al. |
| 2010/0039865 A1 | 2/2010 | Kidoh |
| 2010/0123180 A1 | 5/2010 | Takano et al. |
| 2010/0163968 A1 | 7/2010 | Kim et al. |
| 2010/0181612 A1 | 7/2010 | Kito et al. |
| 2010/0187592 A1 | 7/2010 | Chen et al. |
| 2010/0200908 A1 | 8/2010 | Lee et al. |
| 2010/0207193 A1 | 8/2010 | Tanaka et al. |
| 2010/0240205 A1 | 9/2010 | Son et al. |
| 2010/0295120 A1 | 11/2010 | Sandhu et al. |
| 2010/0323505 A1 | 12/2010 | Ishikawa et al. |
| 2011/0002178 A1 | 1/2011 | Hwang et al. |
| 2011/0024818 A1 | 2/2011 | Ahn |
| 2011/0049608 A1 | 3/2011 | Kidoh et al. |
| 2011/0065270 A1 | 3/2011 | Shim et al. |
| 2011/0073866 A1 | 3/2011 | Kim et al. |
| 2011/0147823 A1 | 6/2011 | Kuk et al. |
| 2011/0201167 A1 | 8/2011 | Satonaka et al. |
| 2011/0220987 A1 | 9/2011 | Tanaka et al. |
| 2011/0233646 A1 | 9/2011 | Mizushima et al. |
| 2011/0248327 A1 | 10/2011 | Son et al. |
| 2011/0248334 A1 | 10/2011 | Sandhu et al. |
| 2011/0294290 A1 | 12/2011 | Nakanishi |
| 2012/0001247 A1 | 1/2012 | Alsmeier |
| 2012/0001249 A1 | 1/2012 | Alsmeier et al. |
| 2012/0001252 A1 | 1/2012 | Alsmeier et al. |
| 2012/0058629 A1 | 3/2012 | You et al. |
| 2012/0068242 A1 | 3/2012 | Shin et al. |
| 2012/0077320 A1 | 3/2012 | Shim et al. |
| 2012/0112264 A1 | 5/2012 | Lee et al. |
| 2012/0132981 A1 | 5/2012 | Imamura et al. |
| 2012/0217564 A1 | 8/2012 | Tang et al. |
| 2012/0231593 A1 | 9/2012 | Joo et al. |
| 2012/0256247 A1 | 10/2012 | Alsmeier |
| 2012/0273870 A1 | 11/2012 | Liu |
| 2012/0326221 A1 | 12/2012 | Sinha |
| 2013/0034594 A1 | 2/2013 | Monzyk et al. |
| 2013/0049095 A1 | 2/2013 | Whang et al. |
| 2013/0077380 A1 | 3/2013 | Sakamoto |
| 2013/0089974 A1 | 4/2013 | Lee et al. |
| 2013/0119452 A1 | 5/2013 | Endoh et al. |
| 2013/0171788 A1 | 7/2013 | Yang et al. |
| 2013/0248974 A1 | 9/2013 | Alsmeier et al. |
| 2013/0270625 A1 | 10/2013 | Jang et al. |
| 2013/0307053 A1 | 11/2013 | Polishchuk et al. |
| 2013/0322174 A1 | 12/2013 | Li et al. |
| 2014/0131784 A1 | 5/2014 | Davis |
| 2014/0167131 A1 | 6/2014 | Lu et al. |
| 2014/0203344 A1 | 7/2014 | Hopkins et al. |
| 2014/0231954 A1 | 8/2014 | Lue |
| 2014/0264353 A1 | 9/2014 | Lai |
| 2014/0264532 A1 | 9/2014 | Dennison et al. |
| 2014/0264533 A1 | 9/2014 | Simsek-Ege et al. |
| 2014/0264547 A1 | 9/2014 | Kawai et al. |
| 2014/0334230 A1 | 11/2014 | Kwon |
| 2015/0123188 A1 | 5/2015 | Lu et al. |
| 2015/0123189 A1 | 5/2015 | Sun et al. |
| 2015/0140797 A1 | 5/2015 | Hopkins et al. |
| 2016/0049417 A1 | 2/2016 | Dennison et al. |
| 2016/0093626 A1 | 3/2016 | Izumi et al. |
| 2016/0133752 A1 | 5/2016 | Hopkins et al. |
| 2016/0181323 A1 | 6/2016 | Simsek-ege et al. |
| 2016/0336341 A1 | 11/2016 | Sun et al. |
| 2016/0351580 A1 | 12/2016 | Hopkins et al. |
| 2016/0372479 A1 | 12/2016 | Lu et al. |
| 2017/0200801 A1 | 7/2017 | Hopkins et al. |
| 2017/0352704 A1 | 12/2017 | Simsek-ege et al. |
| 2017/0365615 A1 | 12/2017 | Dennison et al. |
| 2018/0350827 A1 | 12/2018 | Dennison et al. |
| 2019/0131315 A1 | 5/2019 | Sun et al. |

FOREIGN PATENT DOCUMENTS

| | | |
|---|---|---|
| CN | 101118910 A | 2/2008 |
| CN | 101211970 A | 7/2008 |
| CN | 101223640 A | 7/2008 |
| CN | 101292351 A | 10/2008 |
| CN | 101364614 A | 2/2009 |
| CN | 101512729 A | 8/2009 |
| CN | 101847602 A | 9/2010 |
| CN | 105027285 A | 11/2015 |
| CN | 105164808 A | 12/2015 |
| CN | 105745749 A | 7/2016 |

(56) References Cited

FOREIGN PATENT DOCUMENTS

| | | |
|---|---|---|
| CN | 105027285 B | 6/2017 |
| CN | 107256867 A | 10/2017 |
| CN | ZL 201480024450.2 | 5/2018 |
| CN | 108461500 A | 8/2018 |
| EP | 2973710 A1 | 1/2016 |
| JP | 2006352104 A | 12/2006 |
| JP | 2007005814 A | 1/2007 |
| JP | 2007294595 A | 11/2007 |
| JP | 2008092708 A | 4/2008 |
| JP | 2008192708 A | 8/2008 |
| JP | 2009158529 A | 7/2009 |
| JP | 2009295617 A | 12/2009 |
| JP | 2011023586 A | 2/2011 |
| JP | 2012094694 A | 5/2012 |
| JP | 2012119445 A | 6/2012 |
| JP | 2012146773 A | 8/2012 |
| JP | 2012227326 A | 11/2012 |
| JP | 2013153382 A | 8/2013 |
| JP | 2013201396 A | 10/2013 |
| JP | 2013219239 A | 10/2013 |
| JP | 2016514371 A | 5/2016 |
| JP | 5965091 B2 | 8/2016 |
| JP | 6434424 B2 | 11/2018 |
| KR | 1020100104908 A | 9/2010 |
| KR | 1020110130916 A | 12/2011 |
| KR | 1020120101818 A | 9/2012 |
| KR | 1020130024303 A | 3/2013 |
| KR | 10-1764626 | 7/2017 |
| KR | 10-1821943 | 1/2018 |
| KR | 10-1896379 B1 | 9/2018 |
| TW | 201236112 A | 9/2012 |
| TW | 201442211 A | 11/2014 |
| TW | 201507168 A | 2/2015 |
| TW | 201526207 A | 7/2015 |
| TW | I548065 B | 9/2016 |
| TW | I575716 | 3/2017 |
| TW | 201737472 A | 10/2017 |
| TW | 201826547 A | 7/2018 |
| WO | WO-2006132158 A1 | 12/2006 |
| WO | WO-2012009140 A2 | 1/2012 |
| WO | WO-2014116864 A1 | 7/2014 |
| WO | WO-2014149740 A1 | 9/2014 |
| WO | WO-2015066447 A1 | 5/2015 |
| WO | WO-2015066463 A1 | 5/2015 |

OTHER PUBLICATIONS

"U.S. Appl. No. 15/470,617, Supplemental Response filed Jun. 19, 2018 to Restriction Requirement dated Dec. 29, 2017 and to Notice of Non-Compliant Amendment dated Apr. 19, 2018", 7 pgs.
"U.S. Appl. No. 13/748,747, Examiner Interview Summary dated Jul. 9, 2014", 3 pgs.
"U.S. Appl. No. 13/748,747, Non Final Office Action dated Apr. 29, 2014", 15 pgs.
"U.S. Appl. No. 13/748,747, Notice of Allowance dated Sep. 24, 2014", 8 pgs.
"U.S. Appl. No. 13/748,747, Response filed Mar. 13, 2014 to Restriction Requirement dated Feb. 21, 2014", 9 pgs.
"U.S. Appl. No. 13/748,747, Response filed Jul. 29, 2014 to Non Final Office Action dated Apr. 29, 2014", 13 pgs.
"U.S. Appl. No. 13/748,747, Restriction Requirement dated Feb. 21, 2014", 6 pgs.
"U.S. Appl. No. 13/838,297, Advisory Action dated Nov. 14, 2014", 3 pgs.
"U.S. Appl. No. 13/838,297, Final Office Action dated Aug. 21, 2014", 10 pgs.
"U.S. Appl. No. 13/838,297, Non Final Office Action dated Apr. 24, 2014", 8 pgs.
"U.S. Appl. No. 13/838,297, Non Final Office Action dated Dec. 17, 2014", 6 pgs.
"U.S. Appl. No. 13/838,297, Notice of Allowance dated Jul. 9, 2015", 9 pgs.
"U.S. Appl. No. 13/838,297, Response filed Mar. 16, 2015 to Non Final Office Action dated Dec. 16, 2014", 10 pgs.
"U.S. Appl. No. 13/838,297, Response filed Apr. 14, 2014 to Restriction Requirement dated Jan. 12, 2014", 7 pgs.
"U.S. Appl. No. 13/838,297, Response filed Jul. 24, 2014 to Non Final Office Action dated Apr. 24, 2014", 9 pgs.
"U.S. Appl. No. 13/838,297, Response filed Oct. 21, 2014 to Final Office Action dated Aug. 21, 2014", 9 pgs.
"U.S. Appl. No. 13/838,297, Restriction Requirement dated Feb. 12, 2014", 6 pgs.
"U.S. Appl. No. 13/838,579, Advisory Action dated Jul. 23, 2015", 3 pgs.
"U.S. Appl. No. 13/838,579, Examiner Interview Summary dated Oct. 29, 2014", 2 pgs.
"U.S. Appl. No. 13/838,579, Final Office Action dated Apr. 24, 2015", 16 pgs.
"U.S. Appl. No. 13/838,579, Non Final Office Action dated Jul. 9, 2014", 12 pgs.
"U.S. Appl. No. 13/838,579, Notice of Allowance dated Oct. 21, 2015", 10 pgs.
"U.S. Appl. No. 13/838,579, Response filed Mar. 31, 2014 to Restriction Requirement dated Feb. 28, 2014", 8 pgs.
"U.S. Appl. No. 13/838,579, Response filed Jun. 24, 2015 to Final Office Action dated Apr. 24, 2015", 12 pgs.
"U.S. Appl. No. 13/838,579, Response filed Sep. 30, 2014 to Non Final Office Action dated Jul. 9, 2014", 10 pgs.
"U.S. Appl. No. 13/838,579, Restriction Requirement dated Feb. 28, 2014", 6 pgs.
"U.S. Appl. No. 13/838,579, Supplemental Amendment filed Oct. 22, 2014", 10 pgs.
"U.S. Appl. No. 14/610,755, Notice of Allowance dated Sep. 1, 2015", 8 pgs.
"U.S. Appl. No. 14/722,824, Amendment Under 37 C.F.R. filed Feb. 2017", 4 pgs.
"U.S. Appl. No. 14/722,824, Examiner Interview Summary dated Nov. 14, 2016", 3 pgs.
"U.S. Appl. No. 14/722,824, Non Final Office Action dated Jul. 25, 2016", 9 pgs.
"U.S. Appl. No. 14/722,824, Notice of Allowance dated Nov. 7, 2016", 5 pgs.
"U.S. Appl. No. 14/722,824, PTO Response to Rule 312 Communication dated Feb. 15, 2017", 2 pgs.
"U.S. Appl. No. 14/722,824, Response filed Jul. 11, 2016 to Restriction Requirement dated May 10, 2016", 7 pgs.
"U.S. Appl. No. 14/722,824, Response filed Oct. 25, 2016 to Non Final Office Action dated Jul. 25, 2016", 7 pgs.
"U.S. Appl. No. 14/722,824, Restriction Requirement dated May 10, 2016", 6 pgs.
"U.S. Appl. No. 14/925,589, Corrected Notice of Allowance dated Jun. 27, 2017", 2 pgs.
"U.S. Appl. No. 14/925,589, Corrected Notice of Allowance dated Sep. 13, 2017", 2 pgs.
"U.S. Appl. No. 14/925,589, Non Final Office Action dated May 19, 2016", 6 pgs.
"U.S. Appl. No. 14/925,589, Notice of Allowance dated Jan. 12, 2017", 7 pgs.
"U.S. Appl. No. 14/925,589, Notice of Allowance dated Apr. 27, 2017", 7 pgs.
"U.S. Appl. No. 14/925,589, Response filed Aug. 18, 2016 to Non Final Office Action dated May 19, 2016", 6 pgs.
"U.S. Appl. No. 14/987,147, Examiner Interview Summary dated Apr. 6, 2017", 3 pgs.
"U.S. Appl. No. 14/987,147, Final Office Action dated Apr. 17, 2017", 10 pgs.
"U.S. Appl. No. 14/987,147, Non Final Office Action dated Jan. 4, 2017", 13 pgs.
"U.S. Appl. No. 14/987,147, Non Final Office Action dated Feb. 16, 2018", 7 pgs.
"U.S. Appl. No. 14/987,147, Non Final Office Action dated Aug. 9, 2016", 6 pgs.
"U.S. Appl. No. 14/987,147, Preliminary Amendment filed Jan. 19, 2016", 7 pgs.

(56) References Cited

OTHER PUBLICATIONS

"U.S. Appl. No. 14/987,147, Response filed Apr. 4, 2017 to Non Final Office Action dated Jan. 4, 2017", 8 pgs.
"U.S. Appl. No. 14/987,147, Response filed May 16, 2018 to Non Final Office Action dated Feb. 16, 2018", 9 pgs.
"U.S. Appl. No. 14/987,147, Response filed Sep. 18, 2017 to Final Office Action dated Apr. 17, 2017", 10 pgs.
"U.S. Appl. No. 14/987,147, Response filed Nov. 9, 2016 to Non Final Office Action dated Aug. 9, 2016", 7 pgs.
"U.S. Appl. No. 15/056,548, Non Final Office Action dated Jan. 25, 2017", 10 pgs.
"U.S. Appl. No. 15/056,548, Notice of Allowance dated May 9, 2017", 9 pgs.
"U.S. Appl. No. 15/056,548, Response filed Apr. 25, 2017 to Non Final Office Action dated Jan. 25, 2017", 11 pgs.
"U.S. Appl. No. 15/056,548, Response filed Nov. 28, 2016 to Restriction Requirement dated Sep. 27, 2016", 7 pgs.
"U.S. Appl. No. 15/056,548, Restriction Requirement dated Sep. 27, 2016", 8 pgs.
"U.S. Appl. No. 15/056,548, Preliminary Amendment filed Mar. 3, 2016", 8 pgs.
"U.S. Appl. No. 15/470,617, Response filed Feb. 28, 2018 to Restriction Requirement dated Dec. 29, 2017", 6 pgs.
"U.S. Appl. No. 15/470,617, Restriction Requirement dated Dec. 29, 2017", 5 pgs.
"U.S. Appl. No. 15/686,389, Non Final Office Action dated May 25, 2018", 10 pgs.
"U.S. Appl. No. 15/686,389, Notice of Allowance dated Oct. 9, 2018", 8 pgs.
"U.S. Appl. No. 15/686,389, Preliminary Amendment filed Nov. 1, 2017", 6 pgs.
"U.S. Appl. No. 15/686,389, Response filed Aug. 27, 2018 to Non-Final Office Action dated May 25, 2018", 9 pgs.
"U.S. Appl. No. 15/691,477, Notice of Allowance dated Feb. 8, 2018", 9 pgs.
"U.S. Appl. No. 15/691,477, Notice of Allowance dated Oct. 10, 2017", 8 pgs.
"Chinese Application Serial No. 201480013075.1, Office Action dated Sep. 19, 2016", w/English Translation, 10 pgs.
"Chinese Application Serial No. 201480013075.1, Preliminary Amendment filed May 30, 2016", W/ English Claims, 48 pgs.
"Chinese Application Serial No. 201480013075.1, Response filed Feb. 3, 2017 to Office Action dated Sep. 19, 2016", w/English Claims, 30 pgs.
"Chinese Application Serial No. 201480024450.2, Office Action dated May 3, 2017", With English Translation, 22 pgs.
"Chinese Application Serial No. 201480024450.2, Response filed Sep. 18, 2017 to Office Action dated May 3, 2017", w/English Claims, 18 pgs.
"European Application Serial No. 14743125.8, Communication Pursuant to Article 94(3) EPC dated May 22, 2017", 6 pgs.
"European Application Serial No. 14743125.8, Extended European Search Report dated Jun. 21, 2016", 8 pgs.
"European Application Serial No. 14743125.8, Preliminary Amendment filed Mar. 9, 2016", 13 pgs.
"European Application Serial No. 14743125.8, Response filed Dec. 1, 2017 to Communication Pursuant to Article 94(3) EPC dated May 22, 2017", 11 pgs.
"European Application Serial No. 14770149.4, Extended European Search Report dated Nov. 25, 2016", 9 pgs.
"European Application Serial No. 14770149.4, Invitation Pursuant to Rule 62a(1) EPC dated Aug. 30, 2016", 2 pgs.
"European Application Serial No. 14770149.4, Preliminary Amendment filed Apr. 28, 2016", 22 pgs.
"International Application Serial No. PCT/US2014/012798, International Preliminary Report on Patentability dated Aug. 6, 2015", 13 pgs.
"International Application Serial. No. PCT/US2014/012798, International Search Report dated May 19, 2014", 3 pgs.
"International Application Serial No. PCT/US2014/012798, Written Opinion dated May 19, 2014", 11 pgs.
"International Application Serial No. PCT/US2014/020658, International Preliminary Report on Patentability dated Sep. 24, 2015", 6 pgs.
"International Application Serial No. PCT/US2014/020658, International Search Report dated Jun. 26, 2014", 3 pgs.
"International Application Serial No. PCT/US2014/020658, Written Opinion dated Jun. 26, 2014", 4 pgs.
"Japanese Application Serial No. 2015-555280, Office Action dated Feb. 27, 2018", w/English Translation, 31 pgs.
"Japanese Application Serial No. 2015-555280, Office Action dated Jul. 4, 2017", w/English Translation, 27 pgs.
"Japanese Application Serial No. 2015-555280, Response filed Oct. 12, 2017 to Office Action dated Jul. 4, 2017", w/English Claims, 17 pgs.
"Japanese Application Serial No. 2016-500651, Notice of Rejection dated Mar. 1, 2016", W/ English Translation, 4 pgs.
"Japanese Application Serial No. 2016-500651, Response filed May 20, 2016 to Notice of Rejection dated Mar. 1, 2016", W/ English Claims, 6 pgs.
"Korean Application Serial No. 10-2015-7029545, Final Office Action dated Mar. 27, 2017", w/English Translation, 6 pgs.
"Korean Application Serial No. 10-2015-7029545, Office Action dated Oct. 18, 2016", (With English Translation), 13 pgs.
"Korean Application Serial No. 10-2015-7029545, Response filed Apr. 25, 2017 to Final Office Action dated Mar. 27, 2017", W/English Claims, 14 pgs.
"Korean Application Serial No. 10-2015-7029545, Response filed Dec. 18, 2016 to Office Action dated Oct. 18, 2016", w/English Claims, 19 pgs.
"Korean Application Serial No. 10-2017-7021238, Office Action dated Aug. 16, 2017", w/English Translation, 5 pgs.
"Korean Application Serial No. 10-2017-7021238, Response filed Oct. 16, 2017 to Office Action dated Aug. 16, 2017", w/English Claims, 12 pgs.
"Protrusion", Merriam-Webster Dictionary, 2 pgs.
"Taiwanese Application Serial No. 103102815, Amendment filed Nov. 10, 2014", W/ English Claims, 52 pgs.
"Taiwanese Application Serial No. 103109314, Office Action dated Apr. 6, 2017", w/English Translation, 23 pgs.
"Taiwanese Application Serial No. 103109314, Response filed Oct. 3, 2017 to Office Action dated Apr. 6, 2017", w/English Translation, 41 pgs.
"Taiwanese Application Serial No. 104110136, Office Action dated Jan. 26, 2016", W/ English Translation, 3 pgs.
"Taiwanese Application Serial No. 104110136, Response filed Apr. 28, 2016 to Office Action dated Jan. 26, 2016", W/ English Claims, 7 pgs.
Hang-Ting, Lue, et al., "A Novel Planar Floating-Gate (FG)/ Charge Trapping (CT) NAND Device Using BE-SONOS Inter-Poly Dielectric (IPD)", In proceeding of: Electron Devices Meeting (IEDM), (2009), 34.3:1-4.
Kitamura, Takuya, et al., "A Low Voltage Operating Flash Memory Cell with High Coupling Ratio", (1998), 2 pgs.
Kuppurao, Satheesh, et al., "EQuipment Frontiers: Thermal Processing: In situ steam generation: A new rapid thermal oxidation technique", Solid State Technology, (Jul. 2000), Cover, Index, 233-239.
Seo, Moon-Sik, et al., "The 3 dimensional Vertical FG NAND Flash Memory Cell Arrays with the Novel Electrical S/D/ Technique using the Extending Sidewall Contral Gate (ESCG)", 4 pages.
U.S. Appl. No. 14/069,553, Restriction Requirement dated Feb. 10, 2015, 10 pgs.
U.S. Appl. No. 14/069,553, Response filed Apr. 10, 2015 to Restriction Requirement dated Feb. 10, 2015, 6 pgs.
U.S. Appl. No. 14/069,553, Non Final Office Action dated Jul. 13, 2015, 16 pgs.
U.S. Appl. No. 14/069,553, Response filed Aug. 12, 2015 to Non Final Office Action dated Jul. 13, 2015, 8 pgs.
U.S. Appl. No. 14/069,553, Final Office Action dated Oct. 5, 2015, 17 pgs.

(56) References Cited

OTHER PUBLICATIONS

U.S. Appl. No. 14/069,553, Response filed Feb. 5, 2016 to Final Office Action dated Oct. 5, 2015, 9 pgs.
U.S. Appl. No. 14/069,553, Advisory Action dated Feb. 22, 2016, 5 pgs.
U.S. Appl. No. 14/069,553, Notice of Allowance dated May 4, 2016, 9 pgs.
U.S. Appl. No. 14/069,574, Restriction Requirement dated Feb. 5, 2015, 10 pgs.
U.S. Appl. No. 14/069,574, Response filed Apr. 6, 2015 to Restriction Requirement dated Feb. 5, 2015, 8 pgs.
U.S. Appl. No. 14/069,574, Non Final Office Action dated Jul. 15, 2015, 15 pgs.
U.S. Appl. No. 14/069,574, Response filed Oct. 15, 2015 to Non Final Office Action dated Jul. 15, 2015, 7 pgs.
U.S. Appl. No. 14/069,574, Final Office Action dated Oct. 29, 2015, 16 pgs.
U.S. Appl. No. 14/069,574, Response filed Jan. 29, 2016 to Final Office Action dated Oct. 29, 2015, 9 pgs.
U.S. Appl. No. 14/069,574, Advisory Action dated Feb. 10, 2016, 4 pgs.
U.S. Appl. No. 14/069,574, Notice of Allowance dated Apr. 27, 2016, 9 pgs.
U.S. Appl. No. 14/987,147, Notice of Allowance dated Sep. 14, 2018, 8 pgs.
U.S. Appl. No. 14/987,147, Corrected Notice of Allowability dated Oct. 15, 2018, 2 pgs.
U.S. Appl. No. 14/987,147, Corrected Notice of Allowability dated Nov. 6, 2018, 2 pgs.
U.S. Appl. No. 14/987,147, Corrected Notice of Allowability dated Nov. 21, 2018, 2 pgs.
U.S. Appl. No. 15/221,131, Restriction Requirement dated Jun. 2, 2017, 6 pgs.
U.S. Appl. No. 15/221,131, Response filed Aug. 2, 2017 to Restriction Requirement dated Jun. 2, 2017, 7 pgs.
U.S. Appl. No. 15/221,131, Non Final Office Action dated Sep. 20, 2017, 15 pgs.
U.S. Appl. No. 15/221,131, Response filed Dec. 20, 2017 to Non-Final Office Action dated Sep. 20, 2017, 10 pgs.
U.S. Appl. No. 15/221,131, Notice of Allowance dated Feb. 9, 2018, 10 pgs.
U.S. Appl. No. 15/221,131, Amendment Under 37 CFR 1.312 filed Apr. 11, 2018, 9 pgs.
U.S. Appl. No. 15/221,131, Notice of Allowance dated Jun. 12, 2018, 10 pgs.
U.S. Appl. No. 15/255,967, Non Final Office Action dated Jul. 27, 2017, 19 pgs.
U.S. Appl. No. 15/255,967, Response filed Oct. 27, 2017 to Non Final Office Action dated Jul. 27, 2017, 9 pgs.
U.S. Appl. No. 15/255,967, Final Office Action dated Jan. 4, 2018, 20 pgs.
U.S. Appl. No. 15/255,967, Response filed Mar. 2, 2018 to Final Office Action dated Jan. 4, 2018, 8 pgs.
U.S. Appl. No. 15/255,967, Non-Final Office Action dated Mar. 28, 2018, 28 pgs.
U.S. Appl. No. 15/255,967, Examiner Interview Summary dated Apr. 17, 2018, 3 pgs.
U.S. Appl. No. 15/255,967, Response filed Aug. 27, 2018 to Non-Final Office Action dated Mar. 28, 2018, 8 pgs.
U.S. Appl. No. 15/255,967, Final Office Action dated Jan. 10, 2019, 14 pgs.
U.S. Appl. No. 15/255,967, Response filed May 10, 2019 to Fina Office Action dated Jan. 10, 2019, 12 pgs.
U.S. Appl. No. 15/255,967, Advisory Action dated Jun. 4, 2019, 5 pgs.
U.S. Appl. No. 15/470,617 Supplemental Response filed Sep. 19, 2018 to Restriction Requirement dated Dec. 29, 2017 and Notices of Non-Compliant Amendment dated Apr. 19, 2018 and Jun. 28, 2018, 6 pgs.

U.S. Appl. No. 15/470,617, Non Final Office Action dated Oct. 4, 2018, 15 pgs.
U.S. Appl. No. 15/980,503, Non Final Office Action dated Oct. 4, 2018, 8 pgs.
U.S. Appl. No. 16/132,984, Preliminary Amendment fled Jan. 18, 2019, 10 pgs.
U.S. Appl. No. 16/132,984, Restriction Requirement dated Feb. 1, 2019, 5 pgs.
U.S. Appl. No. 16/132,984, Response filed Apr. 1, 2019 to Restriction Requirement dated Feb. 1, 2019, 11 pgs.
"Chinese Application Serial No. 201480063209.0, Office Action dated Feb. 2, 2019", W/ English Translation, 13 pgs.
"Chinese Application Serial No. 201480063209.0, Office Action dated Mar. 2, 2018", w/ English Translation, 18 pgs.
"Chinese Application Serial No. 201480063209.0, Response filed Oct. 4, 2018 to Office Action dated Mar. 2, 2018", w/ English Claims, 24 pgs.
"European Application Serial No. 14857452.8, Communication Pursuant to Article 94(3) EPC dated Nov. 13, 2018", 5 pgs.
"European Application Serial No. 14857452.8, Extended European Search Report dated Jun. 7, 2017", 7 pgs.
"European Application Serial No. 14857452.8, Response filed May 23, 2019 to Communication Pursuant to Article 94(3) EPC dated Nov. 13, 2018", w/ English Claims, 29 pgs.
"International Application Serial No. PCT/US2014/063377, International Preliminary Report on Patentability dated May 12, 2016", 8 pgs.
"International Application Serial No. PCT/US2014/063377, International Search Report dated Jan. 23, 2015", 3 pgs.
"International Application Serial No. PCT/US2014/063377, Written Opinion dated Jan. 23, 2015", 6 pgs.
"International Application Serial No. PCT/US2014/063407, International Preliminary Report Patentability dated May 12, 2016", 12 pgs.
"International Application Serial No. PCT/US2014/063407, International Search Report dated Jan. 29, 2015", 3 pgs.
"International Application Serial No. PCT/US2014/063407, Written Opinion dated Jan. 29, 2015", 10 pgs.
"Japanese Application Serial No. 2015-555280, Response filed May 25, 2018 to Office Action dated Feb. 27, 2018", W/ English Claims, 22 pgs.
"Japanese Application Serial No. 2016-526281, Office Action dated Mar. 28, 2017", w/ English Translation, 10 pgs.
"Japanese Application Serial No. 2016-526281, Office Action dated Sep. 26, 2017", With English Translation, 6 pgs.
"Japanese Application Serial No. 2016-526281, Response filed Jun. 27, 2017 to Office Action dated Mar. 28, 2017", W/ English Claims, 16 pgs.
"Japanese Application Serial No. 2016-526281, Response filed Feb. 25, 2017 to Office Action dated Sep. 26, 2017", w/ Amended Claims, 18 pgs.
"Korean Application Serial No. 10-2016-7014682, Office Action dated Jul. 31, 2017", With English Translation, 16 pgs.
"Korean Application Serial No. 10-2016-7014682, Response filed Dec. 28, 2017 to Office Action dated Jul. 31, 2017", w/English Claims, 24 pgs.
"Taiwanese Application Serial No. 107111763, First Office Action dated Jul. 2, 2018", w/ English translation, 6 pgs.
"Taiwanese Application Serial No. 107111763, Response filed Oct. 3, 2018 to First Office Action dated Jul. 2, 2018", w/ English claims, 52 pgs.
U.S. Appl. No. 13/748,747, filed Jan. 24, 2013, 3D Memory, U.S. Pat. No. 8,946,807.
U.S. Appl. No. 14/610,755, filed Jan. 30, 2015, 3D Memory, U.S. Pat. No. 9,230,986.
U.S. Appl. No. 14/987,147, filed Jan. 4, 2016, 3D Memory, U.S. Pat. No. 10,170,639.
U.S. Appl. No. 16/237,356, filed Dec. 31, 2018, 3D Memory.
U.S. Appl. No. 13/838,579, filed Mar. 15, 2013, Cell Pillar Stuctures and Integrated Flows, U.S. Pat. No. 9,276,011.
U.S. Appl. No. 15/056,548, filed Feb. 29, 2016, Cell Pillar Structures and Integrated Flows, U.S. Pat. No. 9,773,841.

(56) References Cited

OTHER PUBLICATIONS

U.S. Appl. No. 15/686,389, filed Aug. 25, 2017, Cell Pillar Structures and Integrated Flows, U.S. Pat. No. 10,217,799.

U.S. Appl. No. 14/069, 553, filed Nov. 1, 2013, Methods and Apparatuses Having Strings of Memory Cells Including a Metal Source, U.S. Pat. No. 9,437,604.

U.S. Appl. No. 15/255,967, filed Sep. 2, 2016, Methods and Apparatuses Having Strings of Memory Cells Including a Metal Source.

CELL PILLAR STRUCTURES AND INTEGRATED FLOWS

PRIORITY APPLICATION

This application is a continuation of U.S. application Ser. No. 15/686,389, filed Aug. 25, 2017, which is a divisional of U.S. application Ser. No. 15/056,548, filed Feb. 29, 2016, now issued as U.S. Pat. No. 9,773,841, which is continuation of U.S. application Ser. No. 13/838,579, filed Mar. 15, 2013, now issued as U.S. Pat. No. 9,276,011, all of which are incorporated herein by reference in their entirety.

BACKGROUND

Computers and other electronic systems, for example, digital televisions, digital cameras, and cellular phones, often have one or more memory and other devices to store information. Increasingly, memory and other devices are being reduced in size to achieve a higher density of storage capacity and/or a higher density of functionality.

DETAILED DESCRIPTION

Figure 1A:
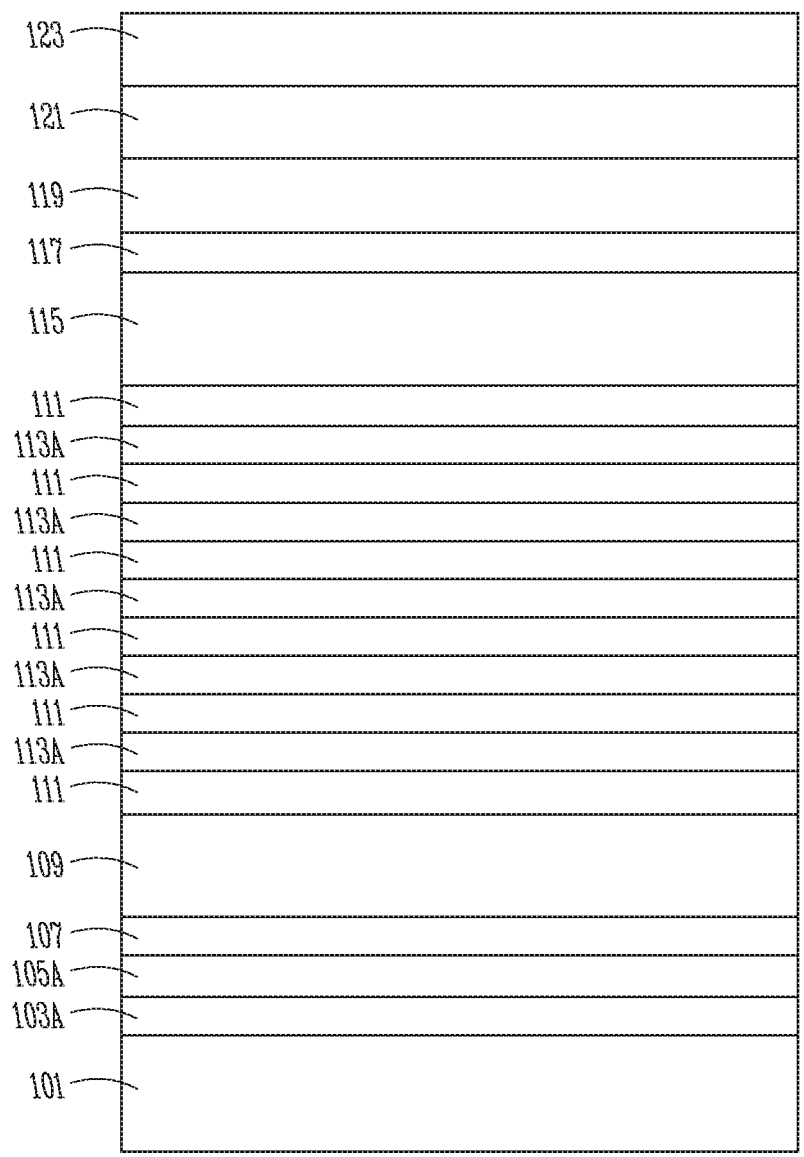
FIG. 1A through FIG. 1H show various portions of a fabrication process to form strings of memory cells, according to an embodiment.

The description that follows includes illustrative apparatuses (circuitry, devices, structures, systems, and the like) and methods (e.g., processes, protocols, sequences, techniques, and technologies) that embody the disclosed subject matter. In the following description, for purposes of explanation, numerous specific details are set forth in order to provide an understanding of various embodiments of the subject matter. After reading this disclosure, it will be evident to person of ordinary skill in the art however, that various embodiments of the subject matter may be practiced without these specific details. Further, well-known apparatuses, methods, and operations have not been shown in detail so as not to obscure the description of various embodiments.

As used herein, the term "or" may be construed in an inclusive or exclusive sense. Additionally, although various embodiments discussed below focus on a three-dimensional (3D) NAND memory device, the embodiments are readily applicable to a number of other electronic devices. Consequently, the described embodiments are merely given for clarity in disclosure, and thus, are not limited to NAND memory devices or even to memory devices in general.

Generally, a 3D electronic device may be considered to be a device formed by a process that combines multiple levels of electronic devices (e.g., one device formed over another) using planar formations (e.g., multiple devices on a single level). Since multiple levels in 3D devices may use approximately the same area on a substrate, an overall density of devices (e.g., memory devices) can be increased in relation to the number of levels. Generally discussed herein are three-dimensional (3D) memories, memory cells, and methods of making and using the same. In one or more embodiments, a 3D vertical memory can include a memory stack sharing a common cell-pillar. A memory stack can include a stack of at least two memory cells and a dielectric between adjacent memory cells, where each memory cell includes a control gate (CG) and a charge storage structure, such as a floating gate (FG) or charge trap (CT), configured to store electrons or holes accumulated thereon. Information is represented by the amount of electrons or holes stored by the cell.

The methods and apparatuses discussed herein can be extended to NOR devices, microcontroller devices, other memory types, general purpose logic, and a host of other apparatuses. Various 3D devices including repeating devices (e.g., SRAM), transistors, standard CMOS logic, and so on may all benefit from application of the fabrication processes disclosed herein.

Prior art devices allowed a continuous cell pillar only from the source through the memory cells. However, a separate photolithography step caused a shoulder to be formed when the drain-side select gate (SGD) was later formed over the memory cells. The shoulder caused a pinch-point, thereby reducing current flow from source to a bitline formed over the SGD.

In various embodiments disclosed herein, a continuous cell pillar is formed substantially through all levels of the 3D devices. Therefore, the cell pillar (e.g., channel) is a continuous formation from at least the source-side select gate (SGS) to SGD. The continuous cell pillar improves current flow over prior art devices by, for example, removing polysilicon-to-polysilicon channel interfaces in between the SGD and the cell pillar and also between the SGS and the cell pillar, as well as eliminating structural offsets within the cell pillar formation of the prior art that limits the current path. Further, the disclosed subject matter reduces process steps and costs. In various embodiments, the channel-to-source interface may be defined by integrating a buffer polysilicon to a transition metal/semiconductor source (e.g., $WSi_x$) source or an etch stop formed using a high-dielectric constant (high-k) material.

Consequently, the disclosed subject matter eliminates certain photolithographic and registration operations and eliminates particular interface and critical dimension/registration offsets as found in the prior art in between, for example, the SGD, the SGS, and the cell-pillar. Further, the disclosed subject matter eliminates or reduces the number of chemical-mechanical planarization (CMP) steps for both the SGS and the cell pillar, reducing SG-to top and bottom access line (e.g., wordline) distances by approximately 50%. Further, an N+ buffer polysilicon may be utilized between the $WSi_x$ source and the channel material forming an ohmic contact.

FIG. 1A through FIG. 1H show various portions of a fabrication process to form strings of memory cells, according to an embodiment. As discussed above, the techniques and fabrication processes described herein can be extended to a number of different apparatuses (e.g., in addition to memory devices) to be fabricated using various processes, including, for example, a three-dimensional process. However, fabrication of a NAND memory device 100 will be described below to retain clarity and consistency in the discussions that follow.

In FIG. 1A, initial formation of the NAND memory device includes forming a source material 101 having levels of various materials formed thereover including various dielectric materials and semiconductor materials as discussed in more detail below. Each of these and other materials described herein may be applied, deposited, or otherwise formed according to techniques and methods known independently in the art. The techniques and methods can include one or more deposition activities, such as chemical vapor deposition (CVD), atomic level deposition (ALD), physical vapor deposition (PVD), or other techniques. Forming multiple materials in various levels may be accomplished via stacked deposition operations.

Although the process acts and operations described herein may refer to particular conductor, semiconductor, or dielectric materials, such as silicon, silicon dioxide, silicon nitride, or others, a person of ordinary skill in the art and familiar with this disclosure will recognize that other conductor, semiconductor, and dielectric materials may be substituted and still be within a scope of the disclosed subject matter. Thus, the material choices and selections presented are merely provided as an aid in understanding one example of a fabrication process.

For example, various types of semiconductor materials, (e.g., single-crystal or amorphous silicon, germanium, other elemental semiconductor materials, compound semiconductor materials, etc.) may be used as an alternative for or in conjunction with other types of semiconductor material. Additionally, various types of dielectric materials, such as tantalum pentoxide ($Ta_2O_5$), silicon nitride ($Si_xN_y$), aluminum oxide ($Al_2O_3$), hafnium oxide ($HfO_2$), and a variety of other organic or inorganic dielectric materials, may be used as an alternative to or in conjunction with others of the materials described. Also, various other combinations of materials may also be substituted or included. For example, in certain applications, described semiconductor materials may be substituted with conductor materials including, for example, silver (Ag), copper (Cu), Aluminum (Al), zinc (Zn), platinum (Pt), tungsten (W), titanium (Ti), or tantalum (Ta).

Further, various formation, process, and other discussions that follow may refer to one material placed, for example, "over" or "above" another material. Such descriptors are relative terms only and obviously depend upon an exact orientation of any resulting device. However, a person of ordinary skill in the art will readily understand the context of such relative terms upon reading and understanding the disclosure provided herein in conjunction with the respective drawings.

With continuing reference to FIG. 1A, the source material 101 can include, for example, a conductively doped polysilicon material or a conductively doped region of a semiconductor substrate. As referred to herein, a semiconductor substrate can be any of various types of substrates used in the semiconductor and allied industries, such as silicon wafers, other elemental semiconductor wafers, compound semiconductor wafers, thin film head assemblies, polyethylene-terephthalate (PET) films deposited or otherwise formed with a semiconducting material layer (followed by an annealing activity, such as excimer laser annealing (ELA) in some embodiments), as well as numerous other types of substrates known independently in the art. Also, in some embodiments, the source material 101 may be formed over a non-semiconductor material (e.g., quartz, ceramic, etc.), or vice-versa. Other embodiments for the source material 101 are discussed, below, with reference to FIG. 2A.

A buffer material 103A is formed over the source material 101 followed by an etch stop 105A. The buffer material 103A may be selected to be a conductive material, for example, a doped polysilicon. In a specific embodiment, the buffer material 103A may be doped as an n-type polysilicon. In various embodiments, the etch stop 105A may comprise a high dielectric constant (high-κ) material such as aluminum oxide ($Al_2O_3$) or other high dielectric constant oxides. In other embodiments, one or more high-κ materials including, for example, hafnium silicate ($HfSiO_4$), zirconium silicate ($ZrSiO_4$), hafnium dioxide ($HfO_2$), and zirconium dioxide ($ZrO_2$) may be selected for the etch stop 105A. Generally, a high dielectric constant material may be considered as any material having a dielectric constant equal or greater than the dielectric constant of silicon dioxide. The dielectric constant for silicon dioxide is approximately 3.9.

Formation of the etch stop 105A is followed by formation of a source-side select gate (SGS) structure including a first dielectric material 107 (e.g., silicon dioxide, $SiO_2$), a semiconductor material 109 (e.g., conductively doped polysilicon), and a second dielectric material 111 (e.g., $SiO_2$).

The first dielectric material 107 and the second dielectric material 111 may be of the same or different materials. Also, the first dielectric material 107 and the second dielectric material 111 may be formed from the same material but by different methods. For example, the first dielectric material 107 may comprise a thermally-grown silicon dioxide material and the second dielectric material 111 may comprise a deposited silicon dioxide material (or vice versa). As a person of ordinary skill in the art understands, there are certain optical, electrical, and other differences between these two types of formed silicon dioxides. Thus, the material choices and selections presented are merely provided as an aid in understanding one example of a fabrication process.

Depending upon an etchant used in later process steps, the semiconductor material 109 may be selected to be a p-type polysilicon (e.g., doped with boron). For example, as discussed in more detail below, a subsequent etch-back process step may employ tetramethyl-ammonium hydroxide (TMAH) as an etchant. TMAH selectively etches n-type and undoped polysilicon but only very slowly etches p-type polysilicon. Selecting the semiconductor material 109 to be p-type polysilicon reduces the amount of the semiconductor material 109 that is etched during a subsequent TMAH etch process.

Still continuing with FIG. 1A, a number of alternating materials can be formed over the second dielectric material 111. In various embodiments, forming the alternating materials begins a fabrication process to form vertical memory cells (e.g., a memory array). In other embodiments, forming the alternating materials begins a fabrication process to form other active device types. The number of alternating materials can be selected depending upon the application and device type desired.

The alternating materials comprise a number of additional dielectric materials 111 and a number of conductor materials 113A. Each of the levels of the dielectric material 111 is separated from a respective adjacent one of the levels of the dielectric material 111 by at least a respective one of the levels of the conductor material 113A.

Each of the additional dielectric materials 111 may comprise silicon dioxide or a number of other dielectric materials. In various embodiments, one or more of the additional dielectric materials 111 may comprise a solid electrolyte. The solid electrolyte may comprise a chalcogenide, for example, silver-doped germanium selenide (Ag—GeSe), silver-doped germanium sulfide (Ag—$GeS_2$), copper-doped germanium sulfide (Cu—$GeS_2$), or copper telluride ($CuTe_x$); or an oxide, e.g. a transition-metal oxide (e.g., $ZrO_x$), a semiconductor oxide (e.g., $SiO_x$), a rare earth oxide (e.g., $YbO_x$), another metal oxide (e.g., $Al_yO_x$), or combinations thereof. (e.g., $ZrSiO_x$). In these embodiments, one or more of the memory cells in the memory array may comprise resistance change memory (RCM) cells. The RCM cells include the type of cell known as a conductive-bridging RAM (CBRAM) memory cell. An operation of the RCM is based on a voltage-driven ionic migration and electrochemical deposition of metal ions within a solid electrolyte.

The conductor materials 113A may comprise conductively doped poly-silicon or a number of other conductor or semiconductor materials. Although each of the dielectric materials 111 and the conductor materials 113A may be construed as being comprised of the same material on each level, respectively, various levels may comprise different materials. For example, a first level of the dielectric material 111 may comprise silicon dioxide while a later-formed second level of the dielectric material 111 may comprise tantalum pentoxide. Similarly, a first level of the conductor material 113A may comprise conductively doped polysilicon while a later-formed second level of the conductor material 113A may comprise conductively-doped germanium, a doped compound-semiconductor material, or a metallic-ion donor such as silver. In a specific exemplary embodiment, the conductor material 113A is a n-type polysilicon.

A drain-side select gate (SGD) comprising a semiconductor material 115 is formed over the alternating materials having the number of additional dielectric materials 111 and the number of conductor materials 113A. As with the semiconductor material 109 and depending upon an etchant used in later process steps, the semiconductor material 115 may be selected to be a p-type polysilicon (e.g., polysilicon doped with boron or other elements from Group 13 of the periodic table). For example, as discussed in more detail below, a subsequent etch-back process step may employ TMAH as an etchant. TMAH selectively etches n-type and undoped polysilicon but only very slowly etches p-type polysilicon. In other embodiments, the semiconductor material 115 may be used for other types of active semiconductor switching devices.

A chemical-mechanical planarization (CMP) etch-stop material 117 may be formed over the semiconductor material 115 and comprises a relatively hard material to act as a stopping point for subsequent CMP processes. The CMP etch-stop material 117 may comprise one or more materials including dielectric materials such as various oxides, oxynitrides, or nitrides.

A cap material 119 is formed over the CMP etch-stop material 117 and provides protection for the underlying materials during subsequent process steps. The cap material 119 may comprise one more materials including oxides, nitrides, high-κ dielectric materials, polysilicon, and other materials independently known in the art. A hard-mask material 121 and a photoresist level 123 allow initial formation of a partial via, or shallow trench, for a subsequent pillar etch operation, discussed below. The hard-mask material 121 may comprise, for example, carbon with a dielectric anti-reflective coating. The cap material 119 and the hard-mask material 121 may be considered to be sacrificial materials provided to aid in subsequent formation steps. After the hard-mask material 121 is patterned and opened for the subsequent pillar etch operation, the photoresist level 123 may be removed.

Table I, below, shows a specific exemplary embodiment of various dimensions (e.g., thicknesses) of the various materials discussed above. A person of ordinary skill in the art will recognize that dimensions and relative dimensional ratios, other than those shown, may function for various device types. However, the dimensions given are provided simply as an aid in understanding the various embodiments discussed herein and should not be considered as the only workable, or even preferable, dimensions.

TABLE I

| Material Level | Element Number | Dimension (nm) |
| --- | --- | --- |
| Source Material | 101 | 50 to 200 |
| Buffer Material | 103A | 30 |
| Etch Stop | 105A | 20 to 50 |
| First Dielectric Material | 107 | 20 to 50 |
| Semiconductor Material | 109 | 100 to 300 |
| Dielectric Material | 111 | 20 |
| Conductor Material | 113A | 30 |
| Semiconductor Material | 115 | 100 to 300 |
| CMP Etch-Stop Material | 117 | 10 to 20 |
| Cap Material | 119 | 200 |

Figure 1B:
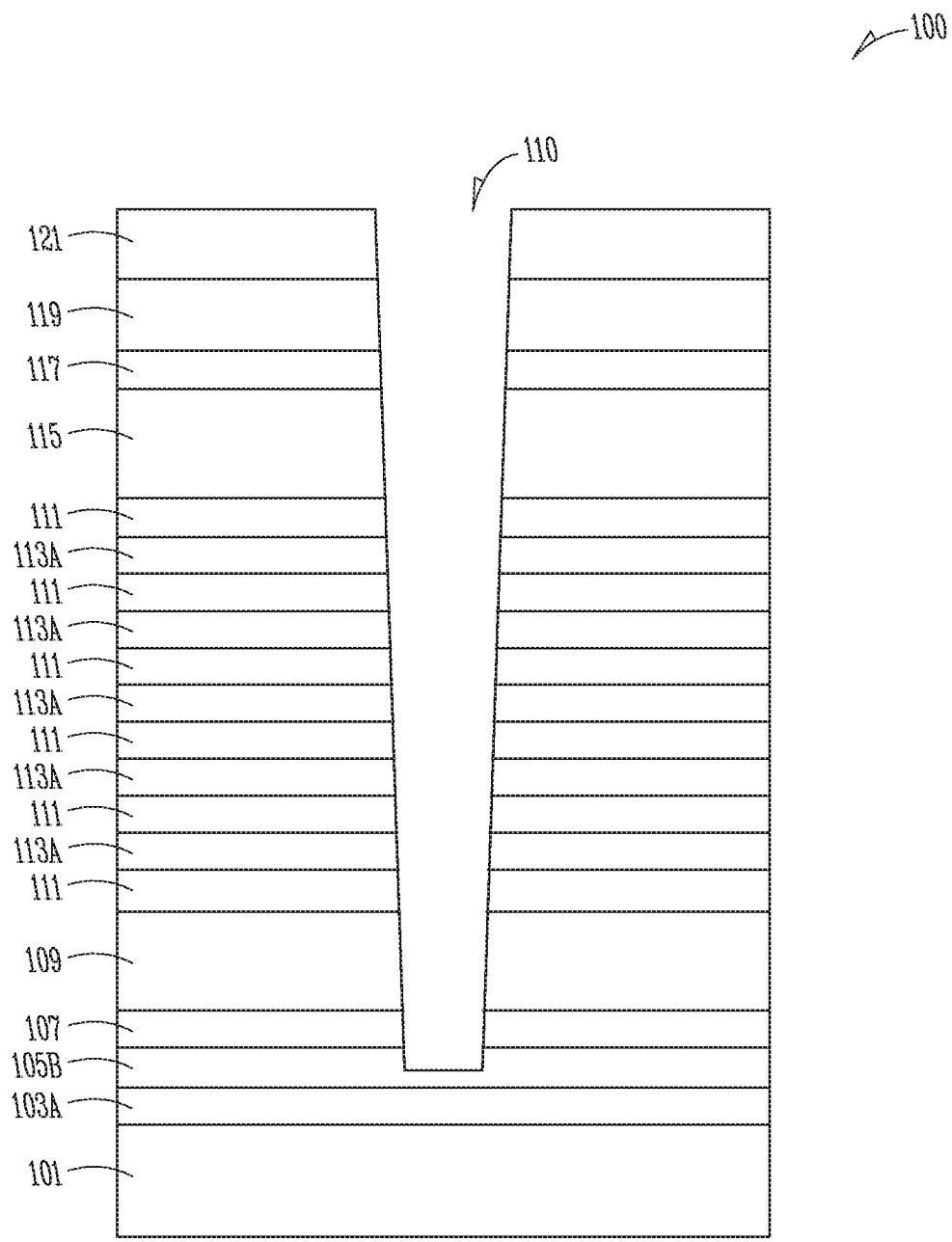

Referring now to FIG. 1B, formation of the NAND memory device 100 continues with formation of a pillar opening 110. The pillar opening 110 is performed in preparation for a subsequent channel formation, discussed below, and may be etched or otherwise formed to be a partial via of various shapes or a trench. For example, in various embodiments, the pillar opening 110 is a trench. In other embodiments, the pillar opening 110 may be comprised of geometries other than a trench. However, for ease in understanding fabrication operations of the disclosed subject matter discussed herein, the pillar opening 110 can be considered to be an opening (e.g., an aperture) formed at least partially through the various materials discussed above.

In a specific embodiment, the pillar opening 110 can be formed by an anisotropic dry etch process (e.g., reactive ion etch (RIE) or plasma etch). In other embodiments, depending upon materials selected, the pillar opening 110 may be formed by one or more various types of chemical etchants (e.g., such as potassium hydroxide (KOH) or tetramethyl ammonium hydroxide (TMAH)), mechanical techniques, other types of ion milling, or laser ablation techniques. Related industries such as those involved in constructing micro-electrical mechanical systems (MEMS) devices may independently supply techniques for still further means to form the pillar opening 110.

The etch stop 105A of FIG. 1A allows the pillar opening 110 to be formed in a single step, unlike the prior art that requires a separate formation and etch of the SGD pillar as discussed above. As disclosed herein, formation of the pillar opening 110 provides a single continuous opening for later formation of channel material. As shown in FIG. 1B, formation of the pillar opening 110 may etch partially into the etch stop 105A (FIG. 1A), forming an etch stop 105B that is at least partially-opened. In a specific exemplary embodiment, an aspect ratio of the overall height of the pillar opening 110 to the width of the opening may be up to 35:1 or more.

Figure 1C:
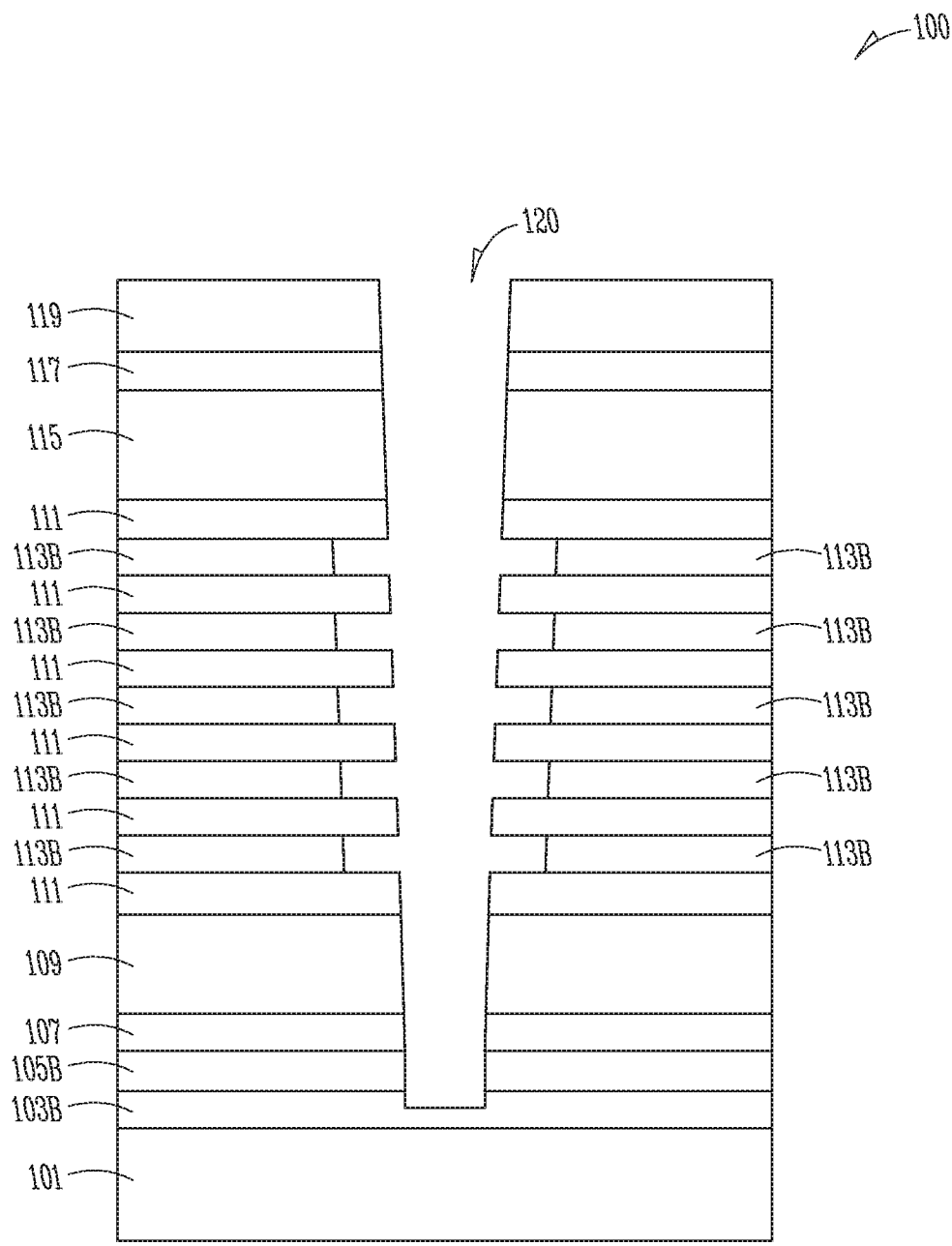

In FIG. 1C, the hard-mask material 121 may be removed. The conductor materials 113A (FIG. 1A and FIG. 1B) are recessed during a control-gate recess operation by etching or otherwise have portions removed laterally (forming a recess away from the sidewall of the pillar opening 110). The control-gate recess operation forms a number of control gates 113B from the conductor material 113A of FIG. 1A, thereby forming a recessed pillar opening 120. An isotropic etchant with a relatively high selectivity ratio may be used to form the recesses of the control gates 113B.

In a specific embodiment, TMAH may be used to form the recesses. TMAH has approximately a 6:1 selectivity ratio based on its ability to etch n-type polysilicon approximately six times faster than p-type polysilicon or dielectric materials. Consequently, due to the high selectivity ratio of TMAH, the n-type polysilicon of the control gates 113B is laterally etched faster than the p-type polysilicon of the semiconductor material 109, 115 or the dielectric materials 107, 111, 119. Although the recessed pillar opening 120 is described as being performed using TMAH as an isotropic etch, a skilled artisan will recognize that other types of chemical and/or mechanical etch or formation processes may be used with an appropriate material selection. For example, other isotropic etchants may also be employed such as a hydrofluoric/nitric/acetic (HNA) acid chemical etchant.

During the TMAH etch operation and potential subsequent cleaning steps, the etch stop 105B is opened to the underlying buffer material 103A (FIG. 1B) that may be at least partially etched to form buffer material 103B (FIG. 1C). Since the buffer material 103B is a conductive material (e.g., n-type polysilicon), the recessed pillar opening 120 allows a subsequently formed channel to be in electrical communication with the source material 101.

Figure 1D:
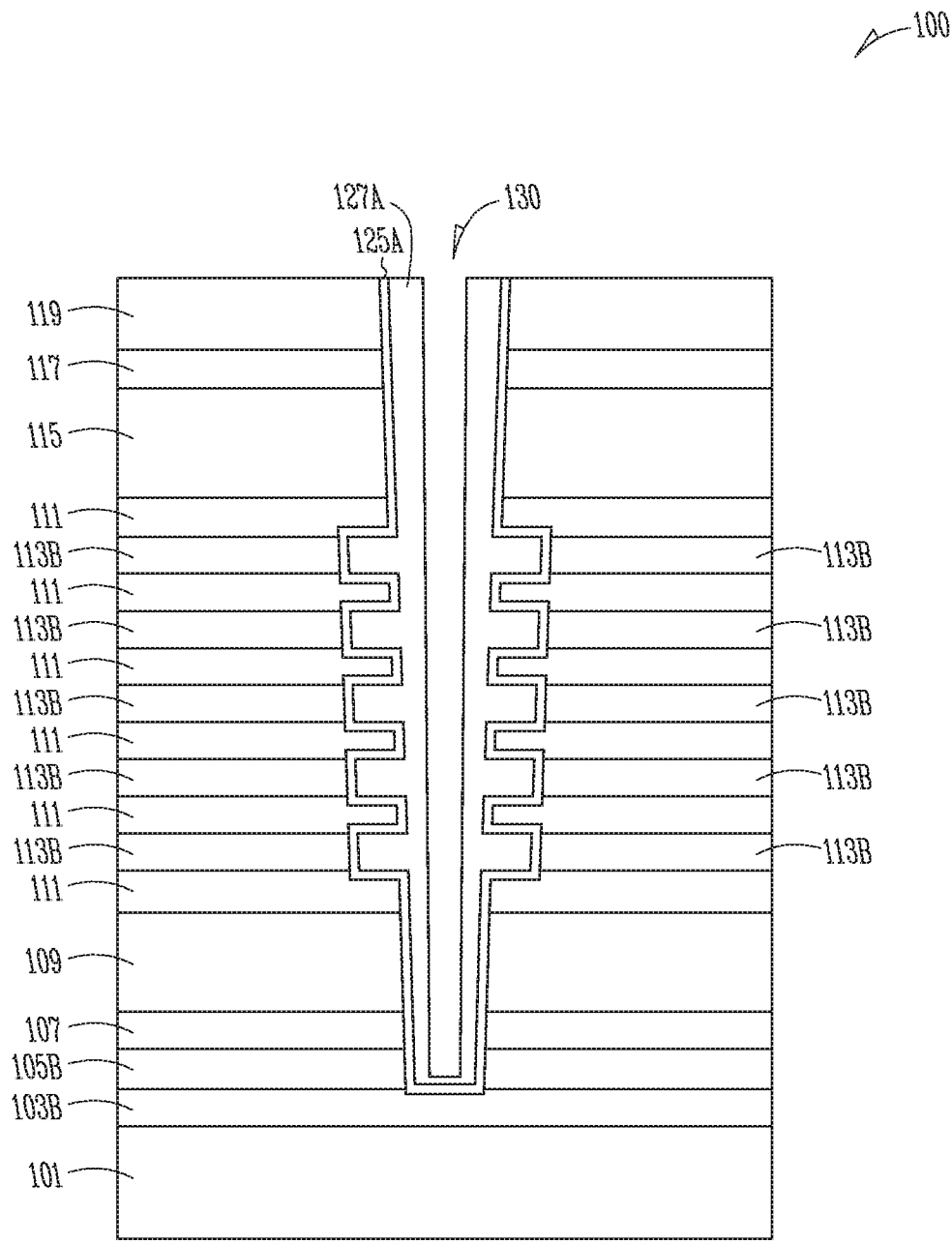

With reference now to FIG. 1D, an inter-polysilicon dielectric (IPD) material 125A, (e.g., a charge blocking dielectric (CBD) material), is formed on the sidewalls of the recessed pillar opening 120 of FIG. 1C, followed by a charge-storage material 127A being formed adjacent to the IPD material 125A. As indicated in FIG. 1D, the IPD material 125A and the charge-storage material 127A are primarily or entirely formed on opposing faces of the recessed pillar opening 120 (FIG. 1C). The formation of the IPD material 125A and the charge-storage material 127A results in a pillar opening 130 that is temporarily reduced in size from the various pillar openings discussed above.

The IPD material 125A may comprise one or more of the various dielectric materials discussed herein, including various high-K dielectric materials. In various embodiments, the IPD material 125A may comprise an oxide-nitride-oxide (ONO) material. The charge-storage material 127A may comprise one or more of the semiconductor materials discussed herein. For example, in various embodiments, the charge-storage material 127A comprises polysilicon. In various embodiments, the charge-storage material 127A comprises silicon nitride (e.g., $Si_3N_4$).

Figure 1E:
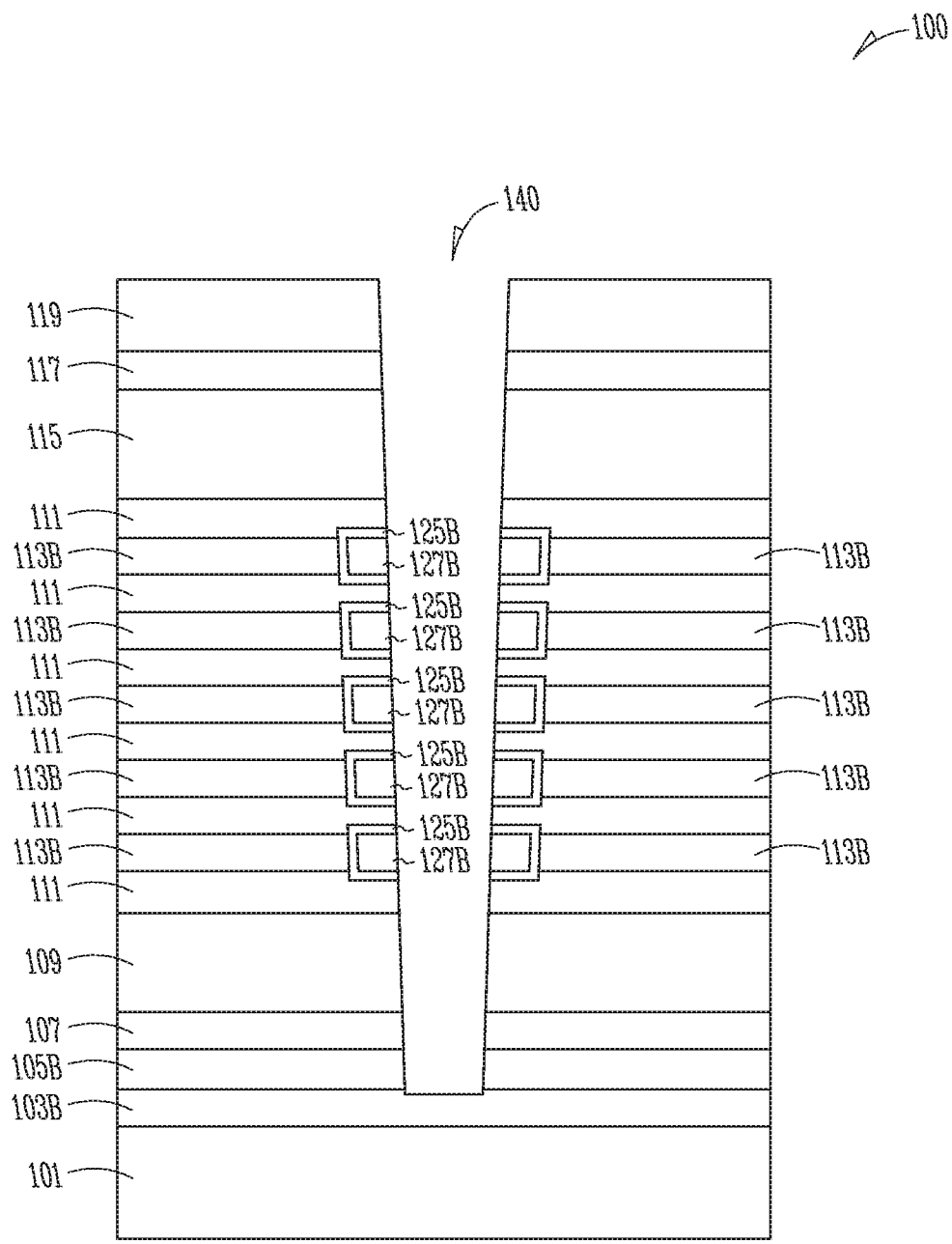

In FIG. 1E, an etch process substantially removes excess amounts of the IPD material 125A and charge-storage material 127A from sidewalls and bottom of the pillar opening 130 of FIG. 1D, forming a cleared pillar opening 140 and leaving a number of charge-storage structures 127B electrically separated from at least proximate (e.g., adjacent) ones of the control gates 113B by a partially surrounding IPD material 125B. Techniques to remove the materials from the pillar opening 130 are known independently in the art.

For example, the charge-storage material 127A may be at least partially removed from the pillar opening 130, and remaining portions of the charge-storage structures 127B may be left in the recesses. In various embodiments, the charge-storage structures 127B may be used to form floating gates or charge traps. Portions of the charge-storage material 127A can be removed using a Certas™ (e.g., a vapor ammonia), an ammonium fluoride and nitric acid mix (NH4F—HNO3), an ozone (O3) or hydrofluoric acid (HF) mix or cycle (e.g., exposed surfaces can be exposed to ozone to create oxide (e.g., oxidize) the surface and the oxidized surface can be exposed to hydrofluoric acid to remove the oxide), hydrofluoric acid and nitric acid mix (HF—HNO3), hydrofluoric acid and hydrogen peroxide mix (HF—H2O2) or a TMAH process. The process used to remove portions of the charge-storage material 127A can be selected as a function of the doping of the charge-storage material 127A. For example, if the charge-storage material 127A is n-type polysilicon, the TMAH process can be used to remove the portions of the charge-storage material 127A.

Figure 1F:
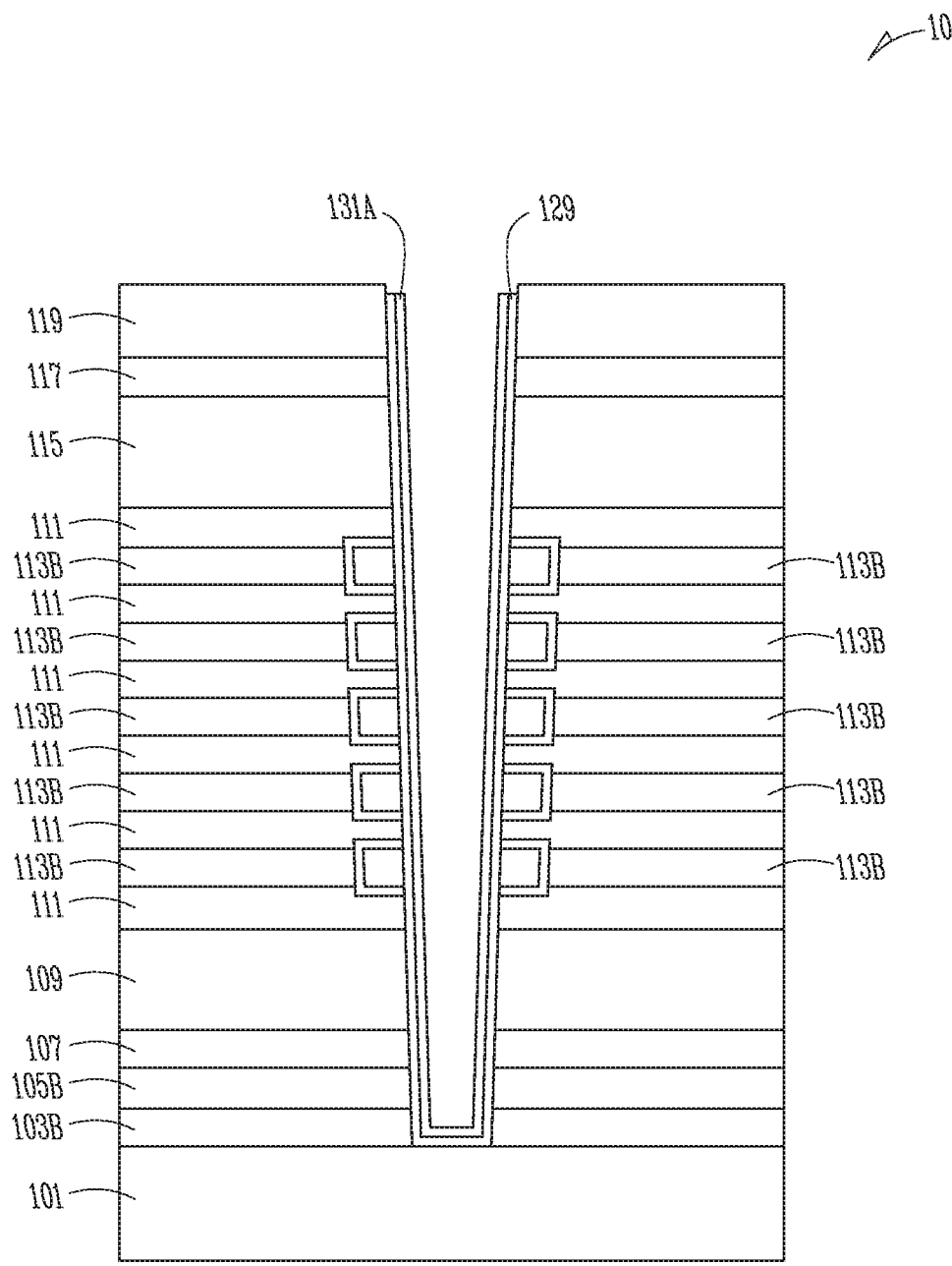

In FIG. 1F, a tunneling material 129 is formed on sidewalls and bottom within the cleared pillar opening 140 (FIG. 1E), followed by formation of a sacrificial liner 131A. The tunneling material 129 may comprise one or more of the dielectric materials discussed herein. The sacrificial liner 131A protects the tunneling material 129 from a subsequent punch-etch operation.

The tunneling material 129 may be formed from a number of dielectric materials discussed herein that allow for Fowler-Nordheim tunneling of electrons or direct tunneling of holes or other injection mechanisms. For example, in various embodiments, the tunneling material 129 comprises deposited and/or thermally-grown silicon dioxide.

In various embodiments, the sacrificial liner 131A may comprise polysilicon. In other embodiments, if the tunneling material is a thermally-grown silicon dioxide, the sacrificial liner 131A may comprise a deposited silicon dioxide that can be chemically removed with a buffered-oxide etchant (BOE), such as such as a combination of ammonium fluoride ($NH_4F$) and hydrofluoric acid (HF) that readily etches materials such as silicon dioxide, but has little affect on materials such as polysilicon. In other embodiments, the sacrificial liner 131A may comprise the same material as the conductor material 113A, and is removed using an isotropic etchant, such as a directional RIE or plasma etch. In still other embodiments, the sacrificial liner 131A may comprise another dielectric such as borophosphosilicate glass (BPSG) supplied from a tetraethoxysilane (TEOS) source. In still other embodiments, the sacrificial liner 131A may comprise a solvent-based liquid that is applied to substrates using a spin-coat process, such as photoresist. The use and application of these various materials will be understood by a person of ordinary skill in the art upon reading and understanding the disclosure provided herein.

Figure 1G:
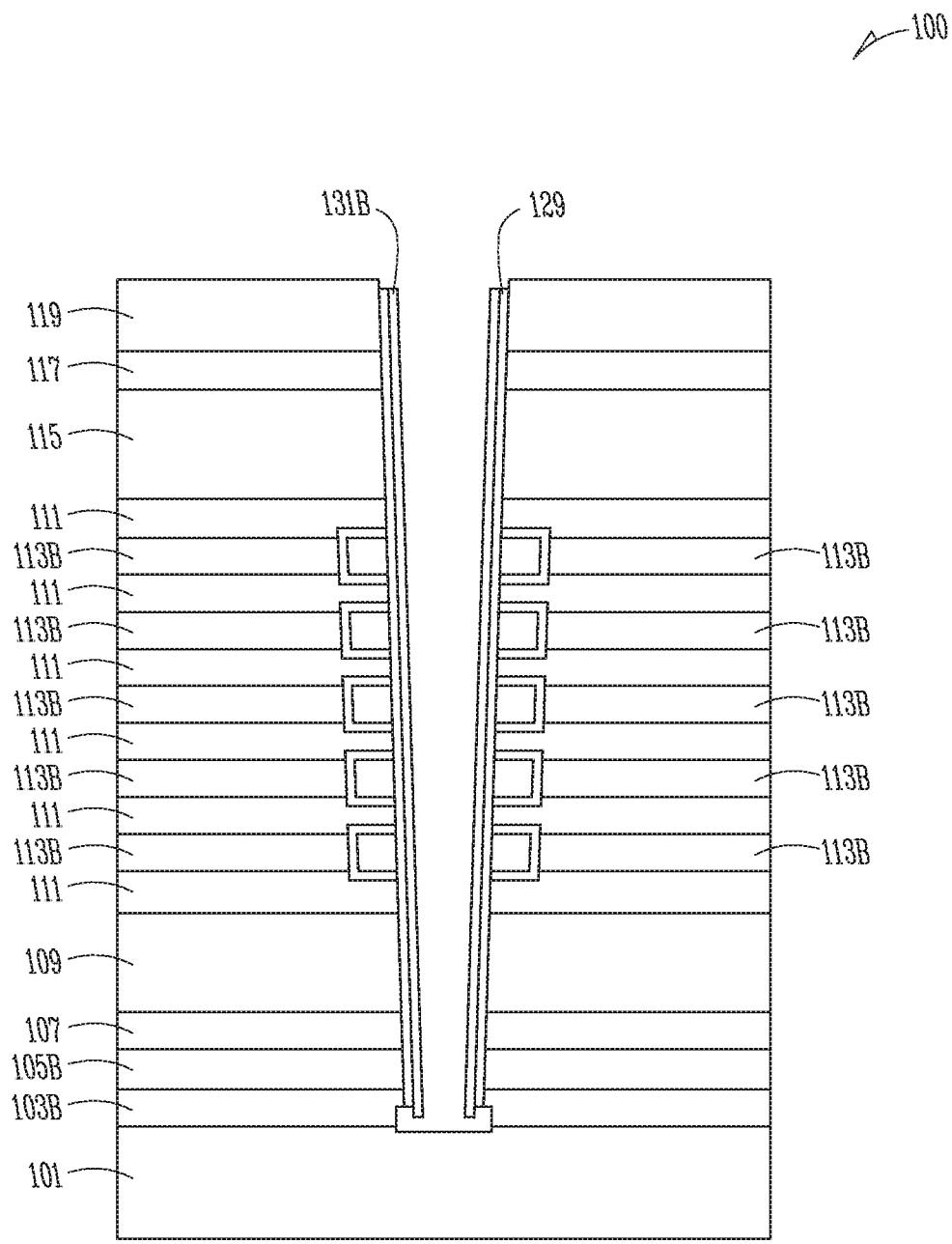

Referring now to FIG. 1G, sacrificial liner portions 131B is formed by, for example, a punch-etch operation that clears at least the bottom portion of the sacrificial liner 131A (FIG. 1F) and the tunneling material 129 opening the pillar opening to the source material 101. The cap material 119 may optionally be removed by the punch-etch operation.

Figure 1H:
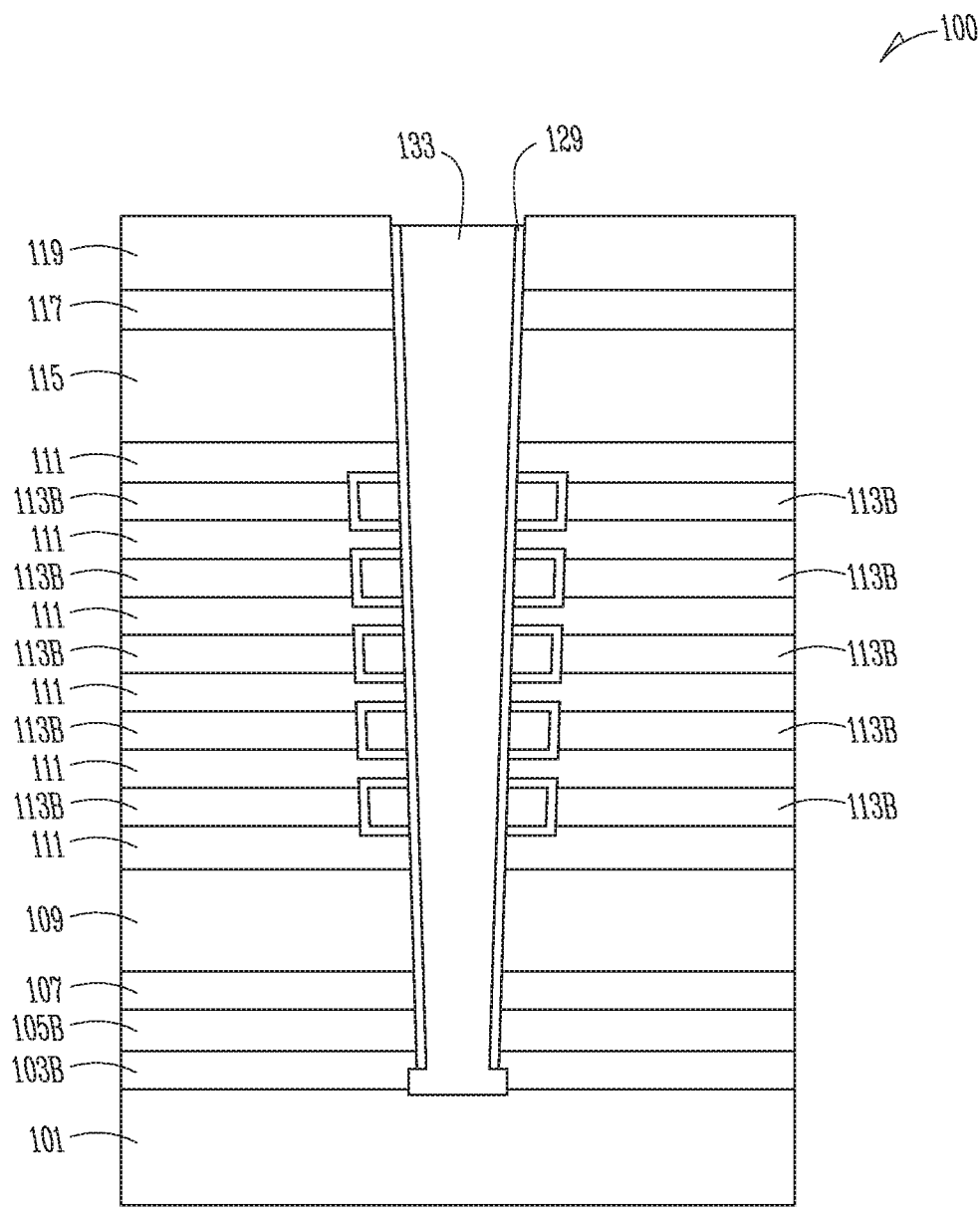

In FIG. 1H, any remaining sacrificial liner portions 131B (FIG. 1G) may be removed and the cleared pillar opening 140 may be filled with a channel-fill material 133 comprising, for example, poly-silicon or other semiconductor material. In various embodiments, the channel-fill material 133 may comprise any one or more of the elemental or compound semiconductor materials discussed above. The channel-fill material 133 may also comprise any of a number of types of single-crystal or amorphous semiconductor materials. For example, the channel-fill material 133 may comprise an epitaxial deposition of silicon, other elemental semiconductor, or compound semiconductor. In other examples, the channel-fill material 133 may comprise a polysilicon material (e.g., a conductively doped polysilicon material) formed by, for example, thermal decomposition or pyrolysis of silane such as a low-pressure chemical vapor deposition (LPCVD) process. Other techniques known independently in the art, such as DC sputtering, followed by a post-anneal activity in some embodiments, may also be utilized.

Although not shown explicitly in FIG. 1H, the cap material 119 may be removed (e.g., if it has not already been removed in a prior process (e.g., an etch step) before the process associated with FIG. 1H). The channel-fill material 133 may then be planarized (e.g., using a chemical-mechanical planarization (CMP) technique) so that the upper surface of the channel-fill material 133 is substantially coplanar with an upper surface of the CMP etch-stop material 117.

Figure 2A:
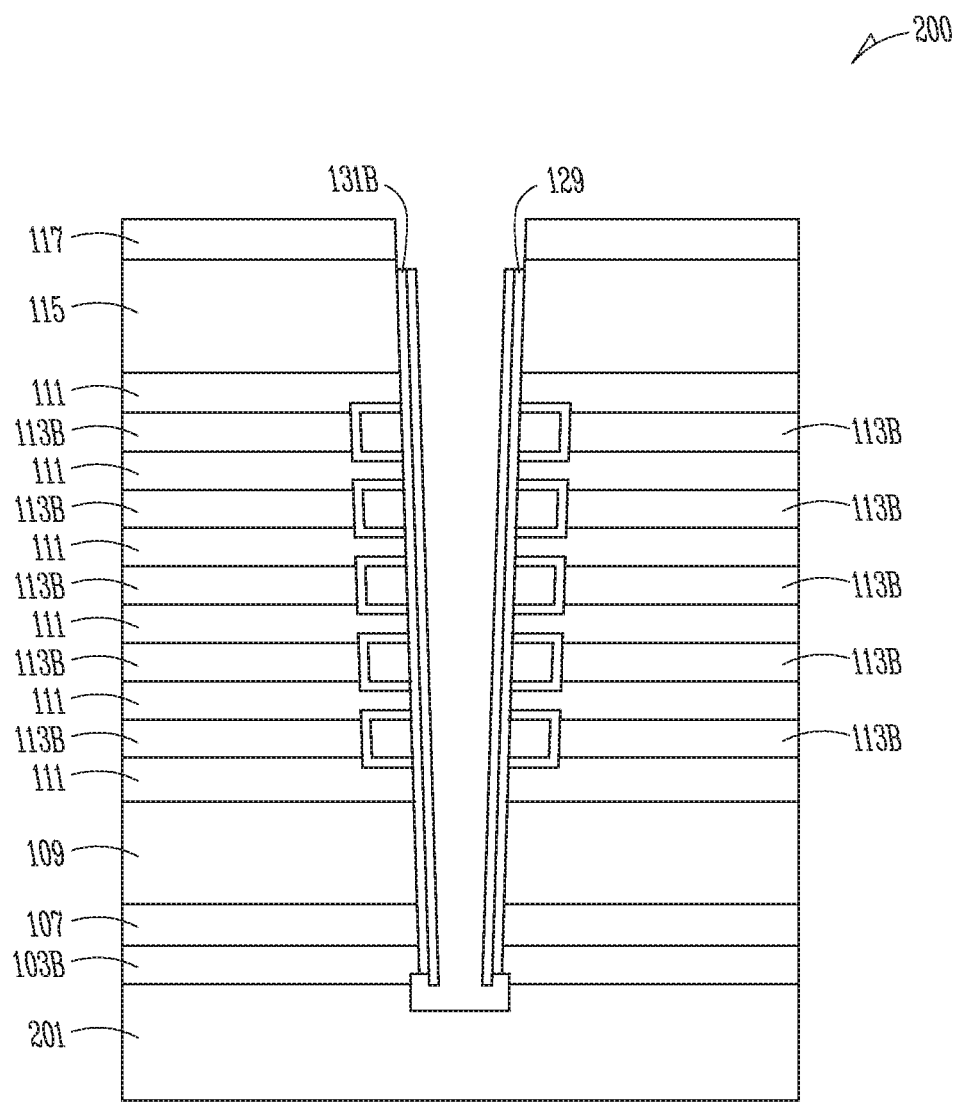
FIG. 2A and FIG. 2B show various portions of a fabrication process to form strings of memory cells, according to an embodiment.
Figure 2B:
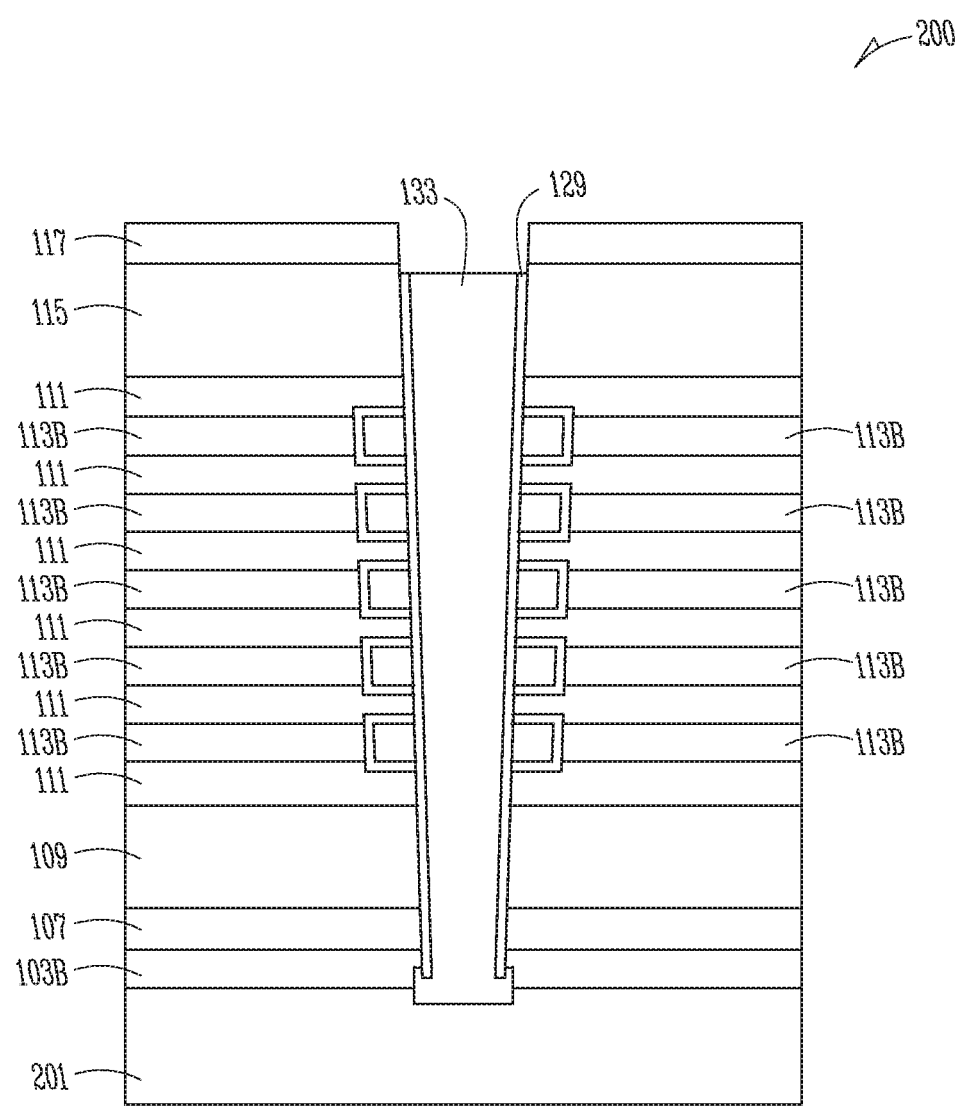

With reference now to FIG. 2A and FIG. 2B, various portions of a fabrication process to form strings of memory cells or other electronic devices, are shown according to an embodiment. The NAND memory device structure 200 of FIG. 2A and FIG. 2B is similar to the NAND memory device 100 of FIG. 1A through FIG. 1H. However, the etch stop 105A (FIG. 1A) comprising, for example, a high-κ dielectric material, may no longer be required as an etch stop for formation of the pillar opening 110 (FIG. 1B). As indicated above, the etch stop 105A of FIG. 1A allows the pillar opening 110 to be formed in a single step.

Instead of the etch stop 105A, a source material 201 is selected to include a transition metal that may be combined with a semiconductor material, forming, for example, an inorganic compound. In a specific exemplary embodiment, tungsten disilicide ($WSi_2$), or more generally, tungsten silicide ($WSi_x$) may be formed for the source material 201 from, for example, using source gases of tungsten hexafluoride ($WF_6$) and monosilane ($SiH_4$) or dichlorosilane ($H_2SiCl_2$) in a chemical vapor deposition (CVD) process. The resulting $WSi_x$ film may subsequently be annealed to form a more conductive, stoichiometric form. In this example, the $WSi_x$ film used to form the source material 201 is a relatively hard material and thus forms an etch stop.

FIG. 2B shows the channel-fill material 133 added to the NAND memory structure 200. As with the NAND memory device 100 of FIG. 1H, a resulting cell pillar formed from the channel-fill material 133 is continuous from the semiconductor material 115 to the source material 201 (or the source material 101 in FIG. 1H). In a specific exemplary embodiment where NAND memory devices are formed using the disclosed subject matter, the cell pillar is continuous and formed in a single-process operation from the SGD to the source.

Figure 3:
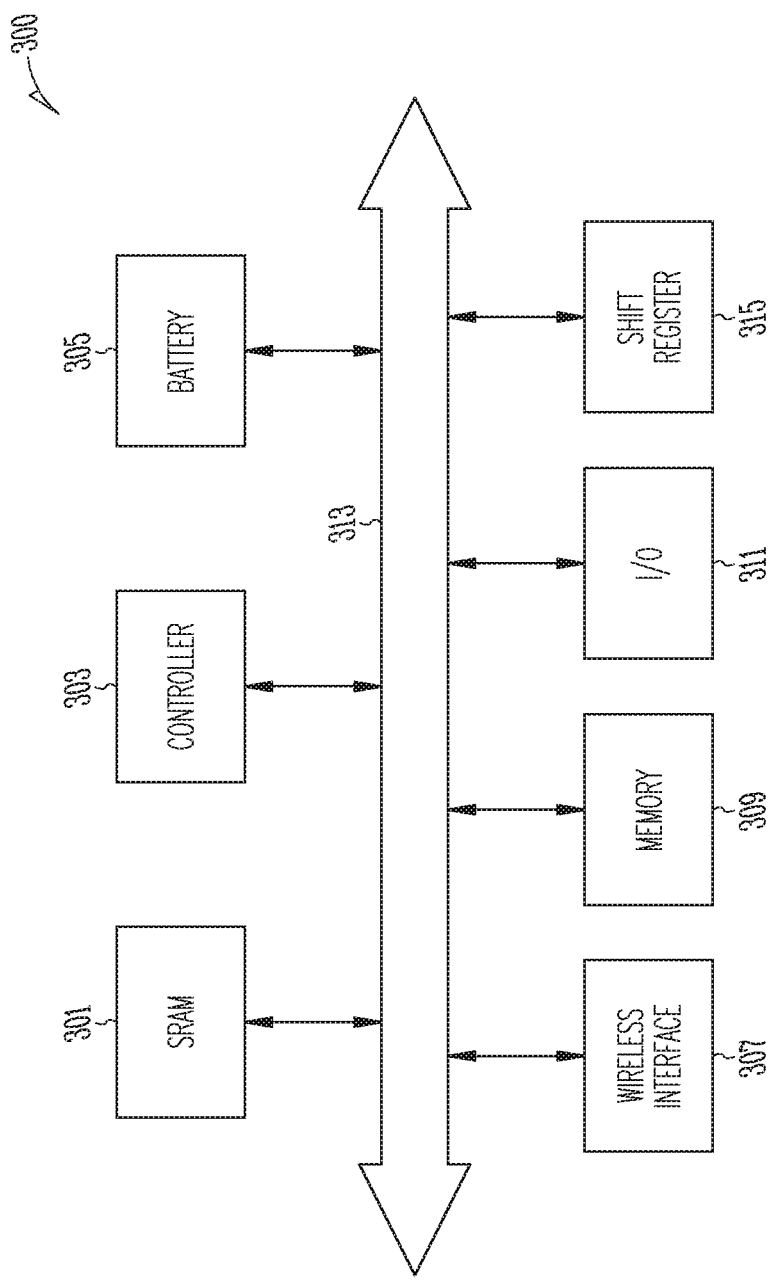
FIG. 3 is a block diagram of a system embodiment, including a memory device according to various embodiments described herein.

FIG. 3 is a block diagram of a system 300 with a memory device that may include one or more of the various embodiments described herein. The system 300 is shown to include a controller 303, an input/output (I/O) device 311 (e.g., a keypad, a touchscreen, or a display), a memory device 309, a wireless interface 307, a static random access memory (SRAM) device 301, and a shift register 315, each coupled to one another via a bus 313. A battery 305 may supply power to the system 300 in one embodiment. The memory device 309 may include a NAND memory, a flash memory, a NOR memory, a combination of these, or the like. The memory device 309 may include one or more of the novel devices and structures described herein.

The controller 303 may include, for example, one or more microprocessors, digital signal processors, micro-controllers, or the like. The memory device 309 may be used to store information transmitted to or by the system 300. The memory device 309 may optionally also be used to store information in the form of instructions that are executed by the controller 303 during operation of the system 300 and may be used to store information in the form of user data either generated, collected, or received by the system 300 (such as image data). The instructions may be stored as digital information and the user data, as disclosed herein, may be stored in one section of the memory as digital information and in another section as analog information. As another example, a given section at one time may be labeled to store digital information and then later may be reallocated and reconfigured to store analog information. The controller 303 may include one or more of the novel devices and structures described herein.

The I/O device 311 may be used to generate information. The system 300 may use the wireless interface 307 to transmit and receive information to and from a wireless communication network with a radio frequency (RF) signal. Examples of the wireless interface 307 may include an antenna, or a wireless transceiver, such as a dipole antenna. However, the scope of the inventive subject matter is not limited in this respect. Also, the I/O device 311 may deliver a signal reflecting what is stored as either a digital output (if digital information was stored), or as an analog output (if analog information was stored). While an example in a wireless application is provided above, embodiments of the inventive subject matter disclosed herein may also be used in non-wireless applications as well. The I/O device 311 may include one or more of the novel devices and structures described herein.

The various illustrations of the procedures and apparatuses are intended to provide a general understanding of the structure of various embodiments and are not intended to provide a complete description of all the elements and features of the apparatuses and methods that might make use of the structures, features, and materials described herein. Based upon a reading and understanding of the disclosed subject matter provided herein, a person of ordinary skill in the art can readily envision other combinations and permutations of the various embodiments. The additional combinations and permutations are all within a scope of the present invention.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus, comprising:
    a source comprising a silicide material;
    a source select gate level extending over the source;
    multiple alternating conductive and dielectric levels extending over the source select gate level, the conductive levels forming memory cell access lines, charge storage structures proximate respective access lines, and
        a charge-blocking dielectric structure extending between the charge storage structures and a respective access line;
    a drain select gate level extending above the multiple conductive levels forming access lines;
    a continuous silicon material extending from an ohmic contact with the silicide material of the source and through the source select gate level and the multiple alternating conductive and dielectric levels, at least to a location within the drain select gate level; and
    a vertical dielectric structure formed between the continuous silicon material and the source select gate level, the charge storage structures, and the drain select gate level.

2. The apparatus of claim 1, wherein the access lines define recesses relative to the alternating dielectric levels, and wherein the charge-blocking dielectric structure extends within the recesses.

3. The apparatus of claim 2, wherein the charge storage structures proximate the access lines comprise charge storage material within each recess between the alternating dielectric levels.

4. The apparatus of claim 3, wherein the charge storage material comprises floating gates formed in respective recesses.

5. The apparatus of claim 3, wherein the charge storage material comprises charge trap material.

6. The apparatus of claim 5, wherein the wherein the charge trap material is formed in respective recesses.

7. The apparatus of claim 2, wherein the charge-blocking dielectric structure comprises multiple dielectric materials, and wherein at least one of the multiple dielectric materials extends only within a respective recess.

8. The apparatus of claim 1, wherein at least one of the dielectric levels comprises a chalcogenide.

9. The apparatus of claim 1, further comprising a doped polysilicon level extending between the silicide source and the source select gate level.

10. The apparatus of claim 9, further comprising an etch stop level extending between the doped polysilicon level and the source select gate level.

11. The apparatus of claim 1, wherein the continuous silicon material comprises a pillar extending from the ohmic contact with the silicide source material to a location within the drain select gate level.

12. The apparatus of claim 1, wherein the continuous silicon material comprises a polysilicon pillar.

13. A memory structure, comprising:
a source comprising tungsten silicide;
a source select gate level extending above the source;
a vertical string of memory cells extending above the source select gate level, the memory cells comprising,
a respective access line formed of a conductive material, the access line separated from at least one vertically adjacent access line by a dielectric level,
a charge storage structure adjacent the respective access line,
a charge-blocking dielectric structure between the respective access line and a first side of the charge storage structure, and
a tunnel dielectric on a second side of the charge storage structure opposite the first side;
a drain select gate level extending above the vertical string of memory cells; and
a continuous polysilicon structure in ohmic contact with the tungsten silicide source and extending at least into the drain select gate level, the continuous polysilicon structure forming a channel of the vertical string of memory cells.

14. The memory structure of claim 13, wherein the tunnel dielectric further extends between material forming the source select gate level and the continuous polysilicon structure, and between material forming the drain select gate level and the continuous polysilicon structure.

15. The memory structure of claim 13, further comprising a doped polysilicon level extending between the source and the source select gate level, the doped polysilicon level contacting the source, and wherein the continuous polysilicon structure extends through the doped polysilicon level.

16. The apparatus of claim 13, wherein the charge storage structures proximate the respective access lines comprise charge storage material within respective recesses formed by respective access lines the alternating dielectric levels.

17. The apparatus of claim 14, wherein the charge storage structures of the memory cells of the vertical string comprise floating gates formed in respective recesses.

18. The apparatus of claim 13, wherein the charge storage structures of the memory cells of the vertical string comprise charge trap material.

19. The apparatus of claim 18, wherein the charge trap material is formed in respective recesses formed by respective access lines between the alternating dielectric levels.

20. The apparatus of claim 13, further comprising an etch stop level extending between the doped polysilicon level and the source select gate level.

* * * * *